(12) United States Patent
Sasaki

(10) Patent No.: US 8,267,597 B2
(45) Date of Patent: Sep. 18, 2012

(54) MOUNTING OF OPTICAL DEVICE ON MOUNTING BOARD TO AT LEAST PROVIDE HEAT RADIATION

(75) Inventor: Junichi Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 455 days.

(21) Appl. No.: 12/545,204

(22) Filed: Aug. 21, 2009

(65) Prior Publication Data

US 2010/0061683 A1 Mar. 11, 2010

(30) Foreign Application Priority Data

Sep. 10, 2008 (JP) ................................. 2008-231693

(51) Int. Cl.
*G02B 6/00* (2006.01)
*G02B 6/36* (2006.01)
(52) U.S. Cl. ........................................ 385/88; 385/147
(58) Field of Classification Search .............. 385/14–15, 385/88, 147
See application file for complete search history.

(56) References Cited

U.S. PATENT DOCUMENTS

| | | | | |
|---|---|---|---|---|
| 6,058,234 | A * | 5/2000 | Tachigori ........................ | 385/49 |
| 6,393,171 | B2 * | 5/2002 | Sasaki et al. .................... | 385/14 |
| 6,632,027 | B1 * | 10/2003 | Yoshida et al. ................. | 385/88 |
| 6,955,481 | B2 * | 10/2005 | Colgan et al. .................. | 385/89 |
| 7,242,823 | B2 * | 7/2007 | Karashima et al. ............. | 385/14 |
| 7,366,367 | B2 * | 4/2008 | Kuhara et al. .................. | 385/14 |
| 7,394,952 | B1 * | 7/2008 | Ueno et al. ...................... | 385/14 |
| 7,488,122 | B2 * | 2/2009 | Hashimoto et al. ............. | 385/92 |
| 7,539,367 | B2 * | 5/2009 | Tamura et al. .................. | 385/14 |
| 7,585,119 | B2 * | 9/2009 | Sasaki ............................. | 385/89 |
| 2002/0015562 | A1 * | 2/2002 | Kikuchi et al. ................. | 385/47 |
| 2004/0081402 | A1 * | 4/2004 | Ouchi .............................. | 385/40 |
| 2006/0159405 | A1 * | 7/2006 | Yajima ............................ | 385/88 |

FOREIGN PATENT DOCUMENTS

| | | |
|---|---|---|
| JP | 2008034622 A | 2/2008 |
| JP | 2008041770 A | 2/2008 |

OTHER PUBLICATIONS

I. Hatakeyama et al, "Optical Module Technology for High-speed Interconnections-System LSI Module with Optical I/O Interfaces", Optronics Magazine, No. 277, pp. 150-186, Jan. 10th, 2005.

* cited by examiner

*Primary Examiner* — Akm Enayet Ullah

(57) ABSTRACT

An optical module includes: an optical device mounting board including a first surface, a second surface on the reverse side, and a light transparent part allowing an emitted light traveling from the first surface to the second surface and a received light traveling in the opposite direction to pass through the transparent part; an optical device mounted on the first surface, which is a light emitting device or a light receiving device; a first terminal mounted on a surface except the first surface of the optical device mounting board; a wiring connecting a second terminal of a component mounted on the first surface including the optical device with the first terminal; and a transmission medium connector connecting a light transmission medium transmitting the emitted light traveling from the second surface to an outside of the optical module or the received light traveling in the opposite direction.

17 Claims, 31 Drawing Sheets

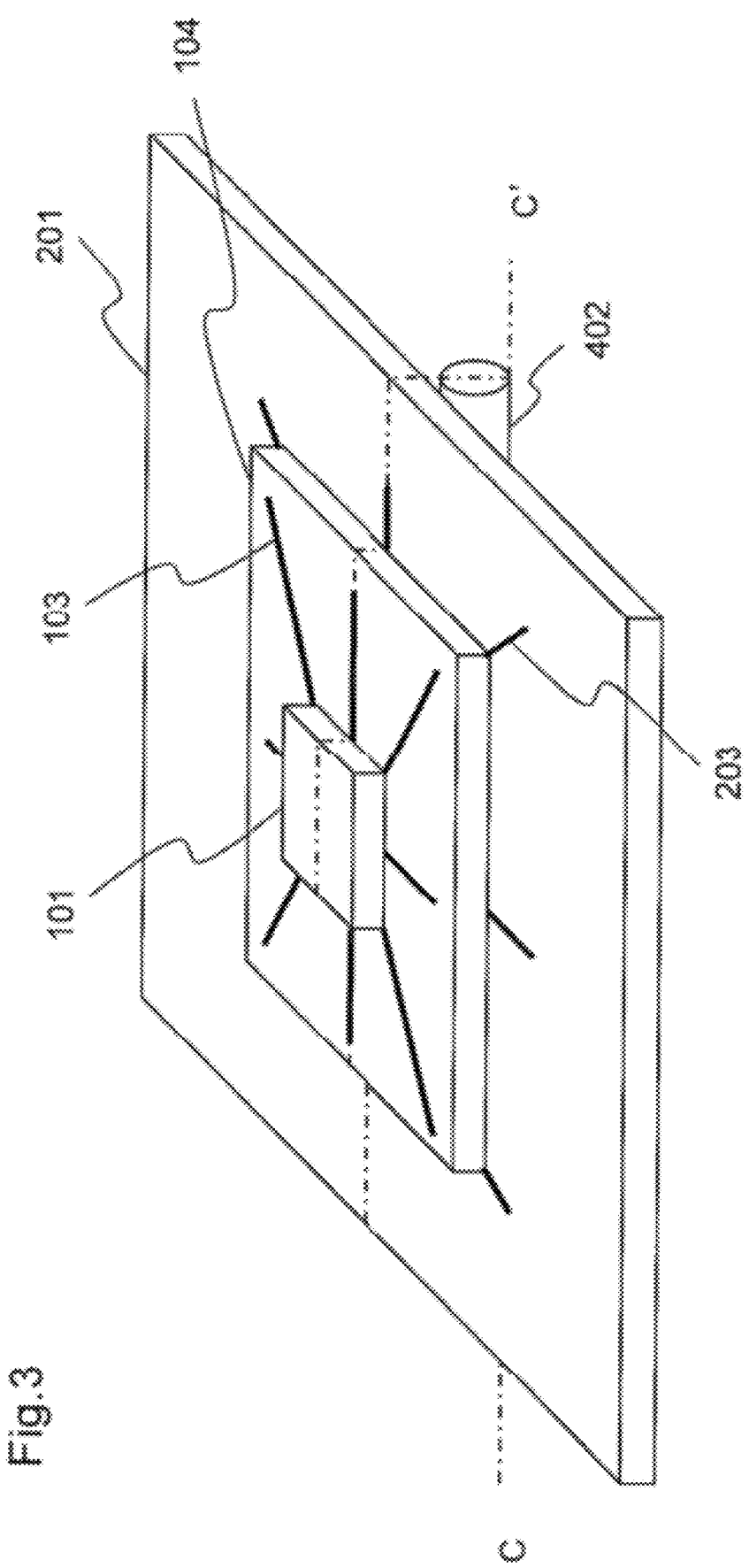

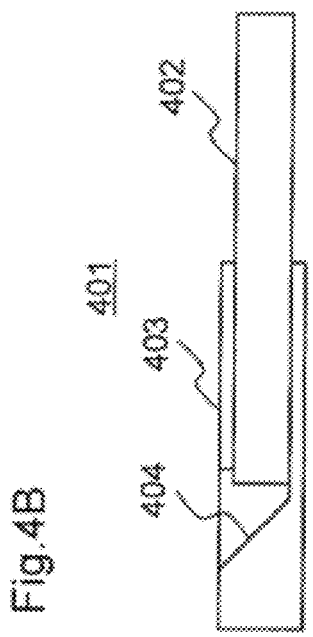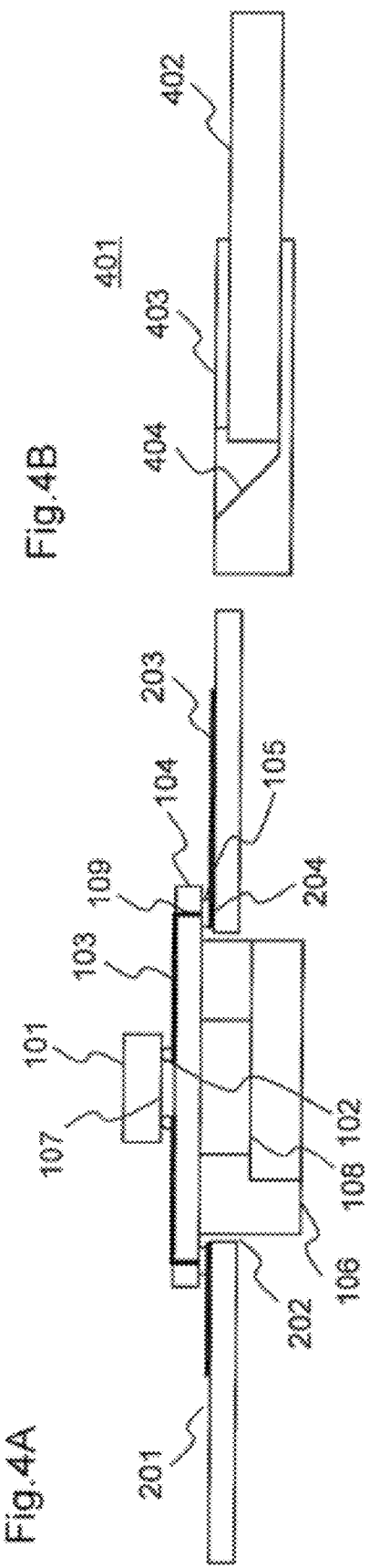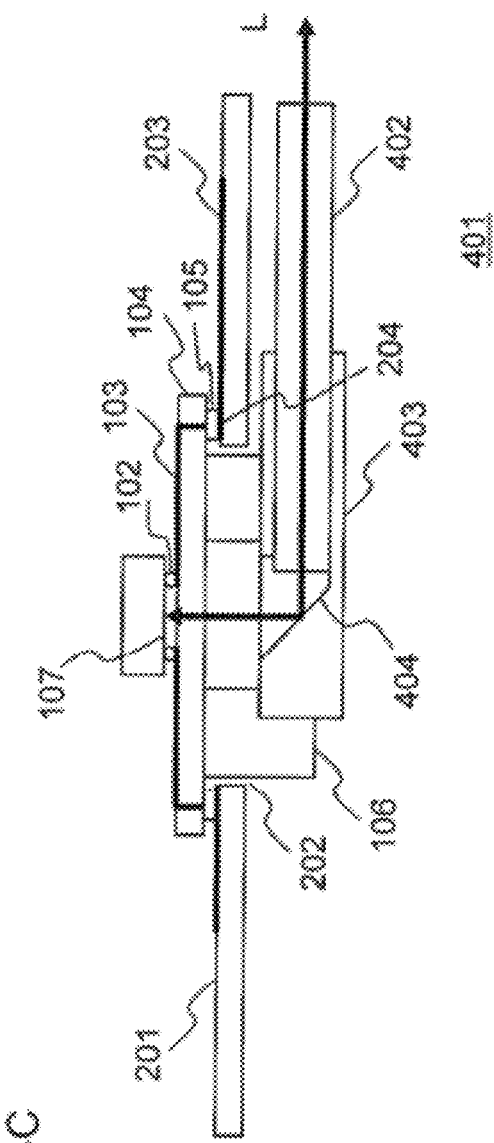

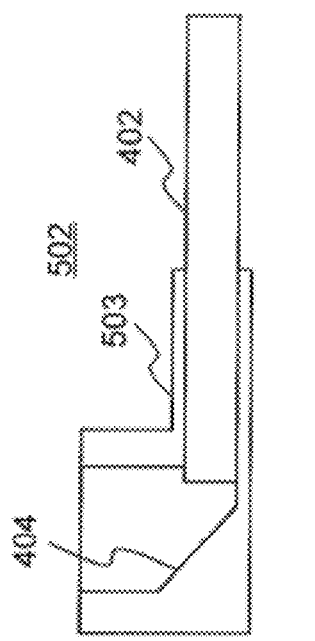
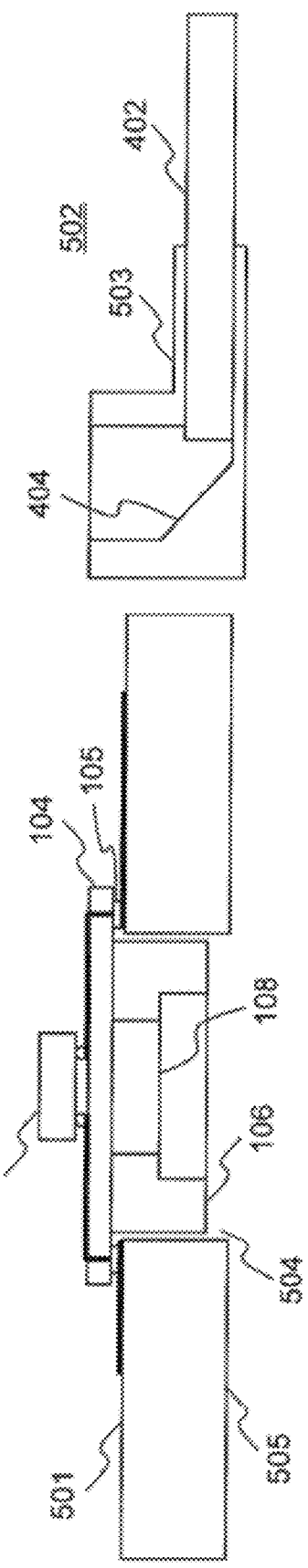
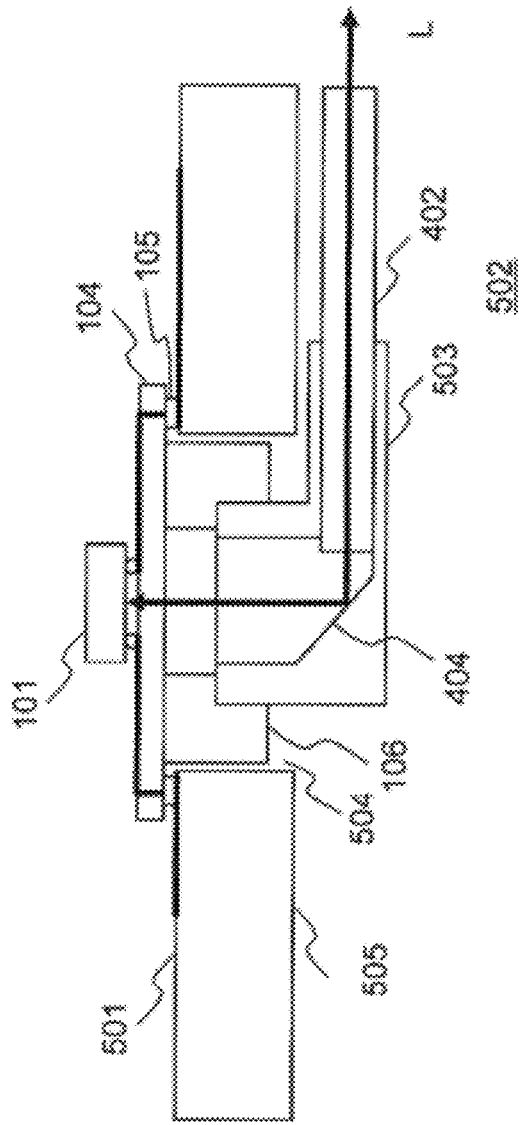

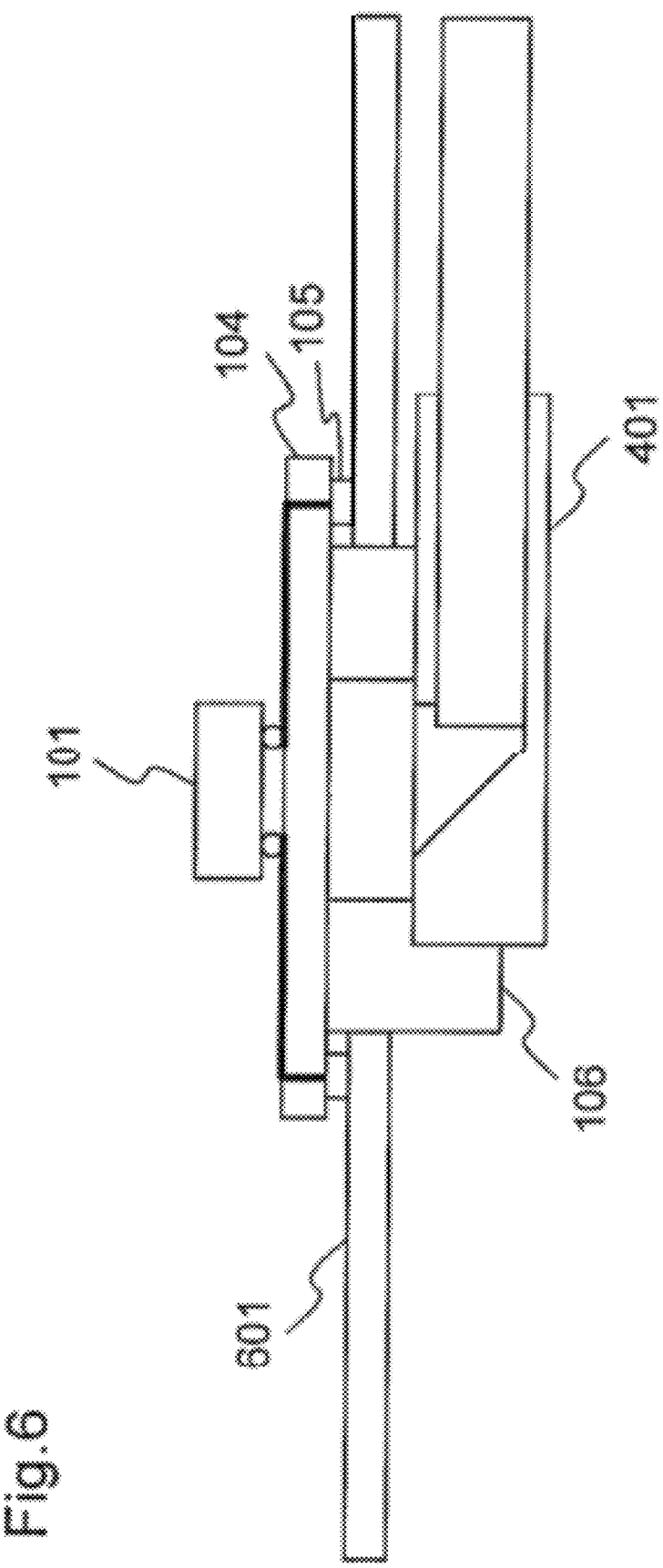

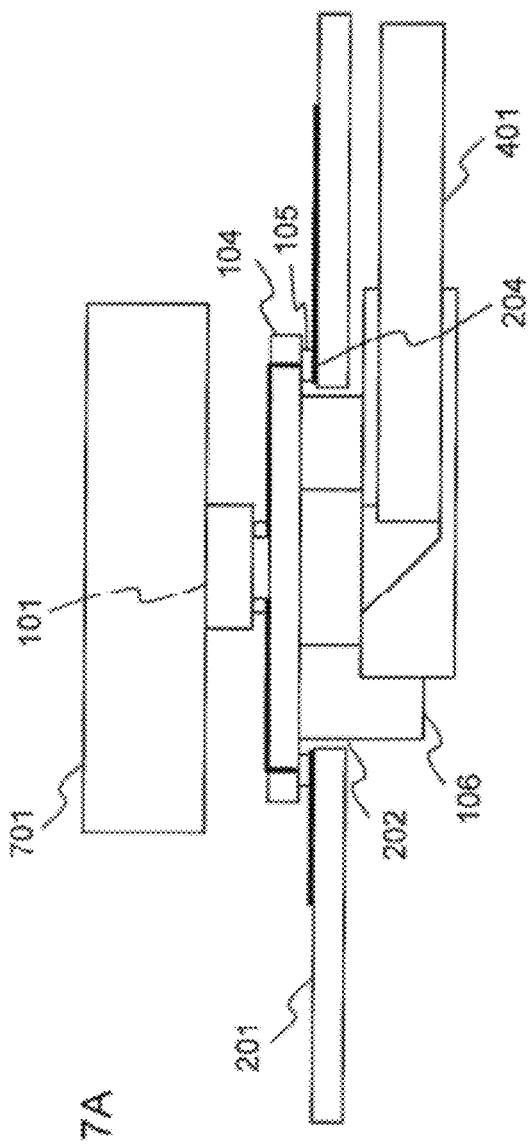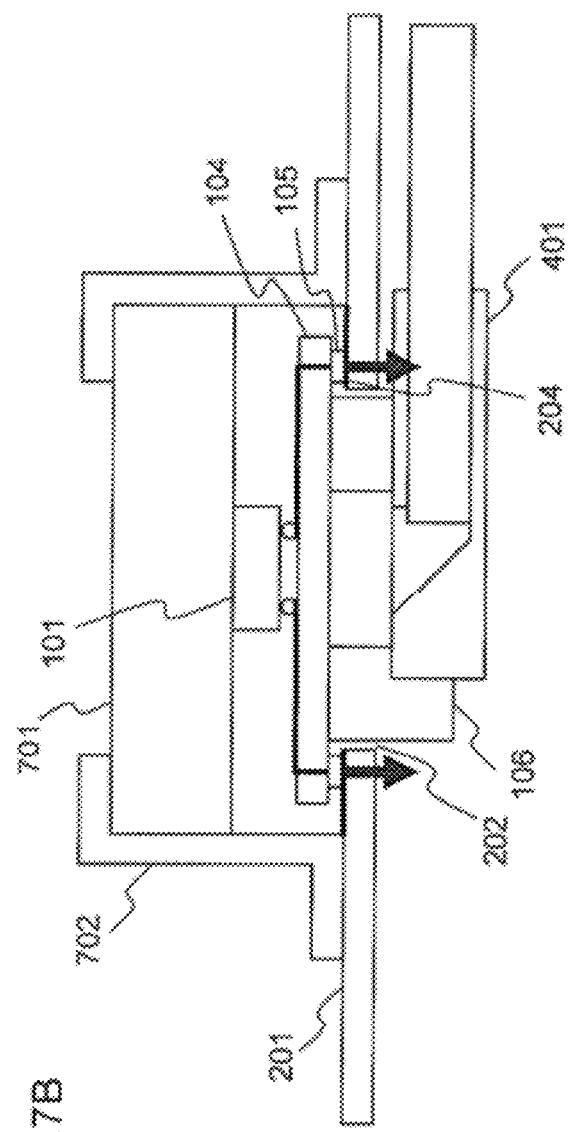

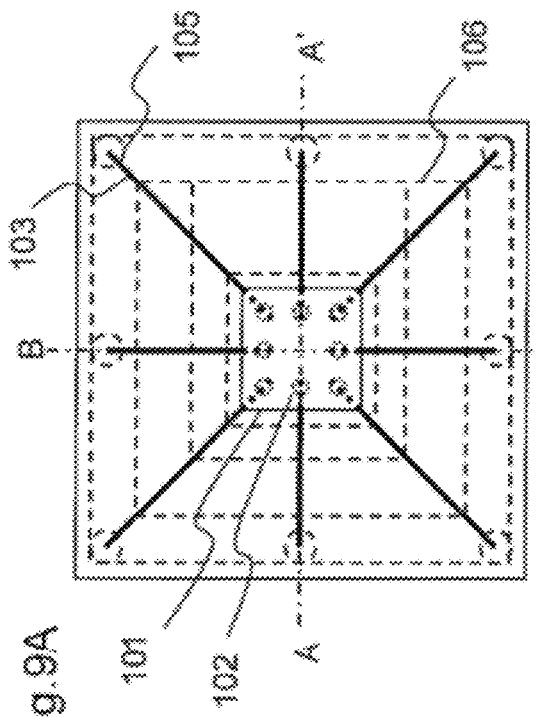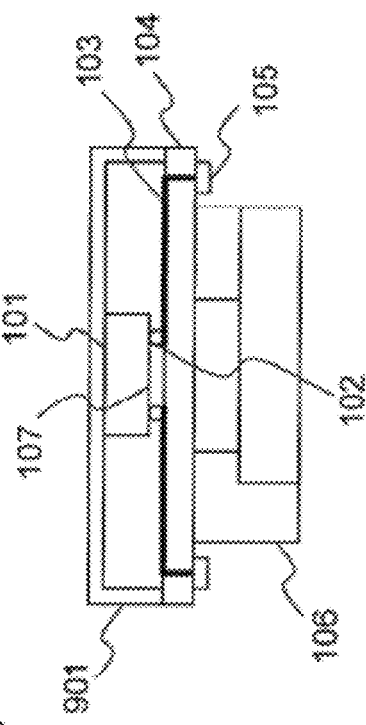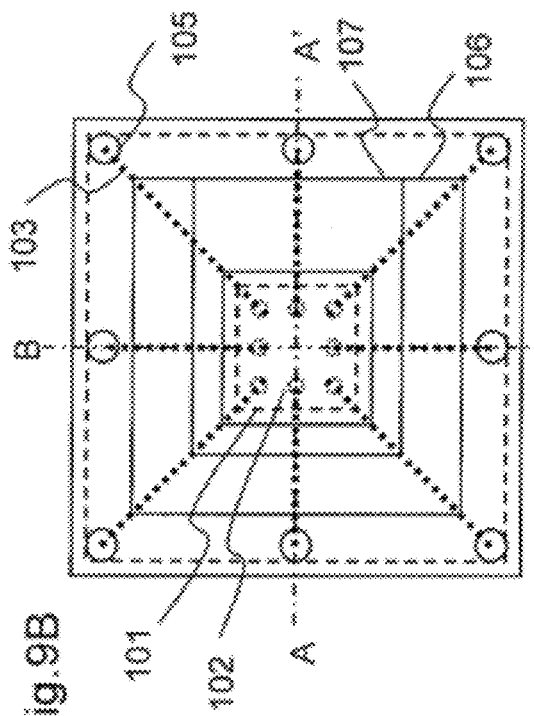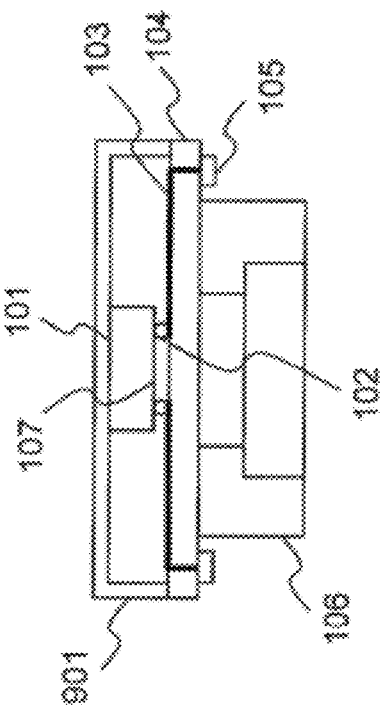

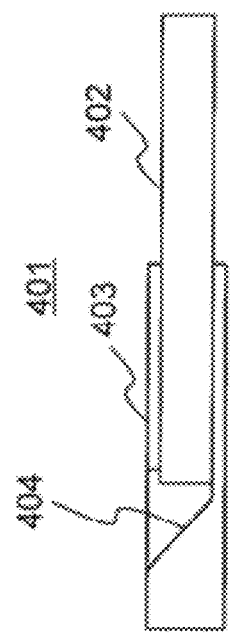
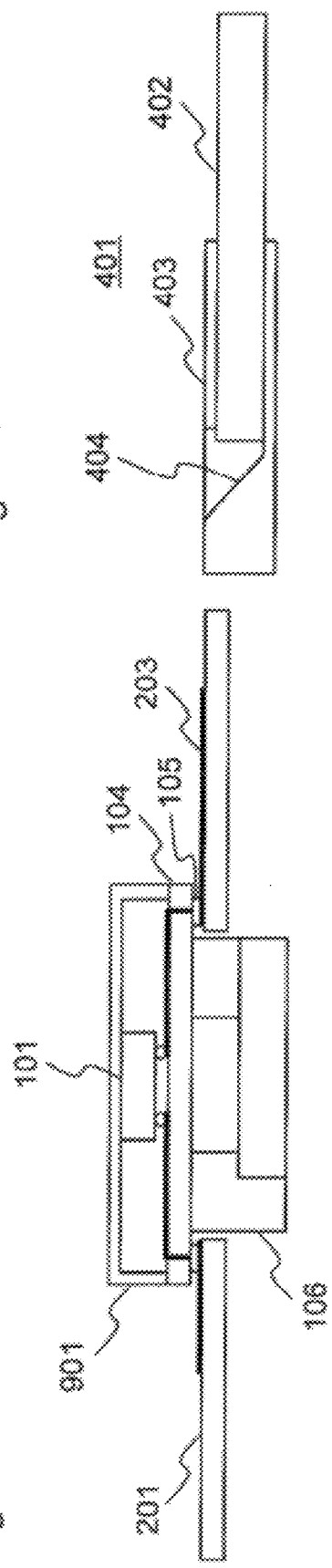
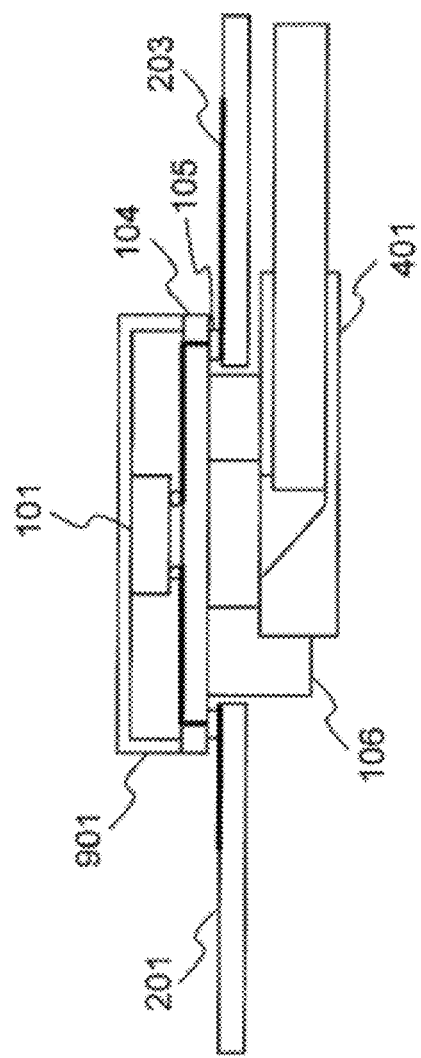

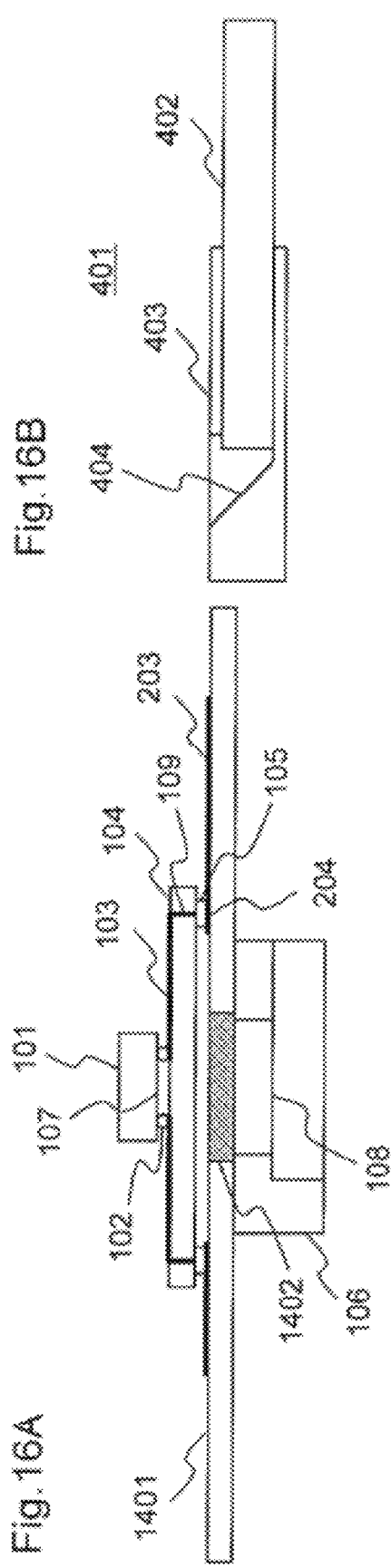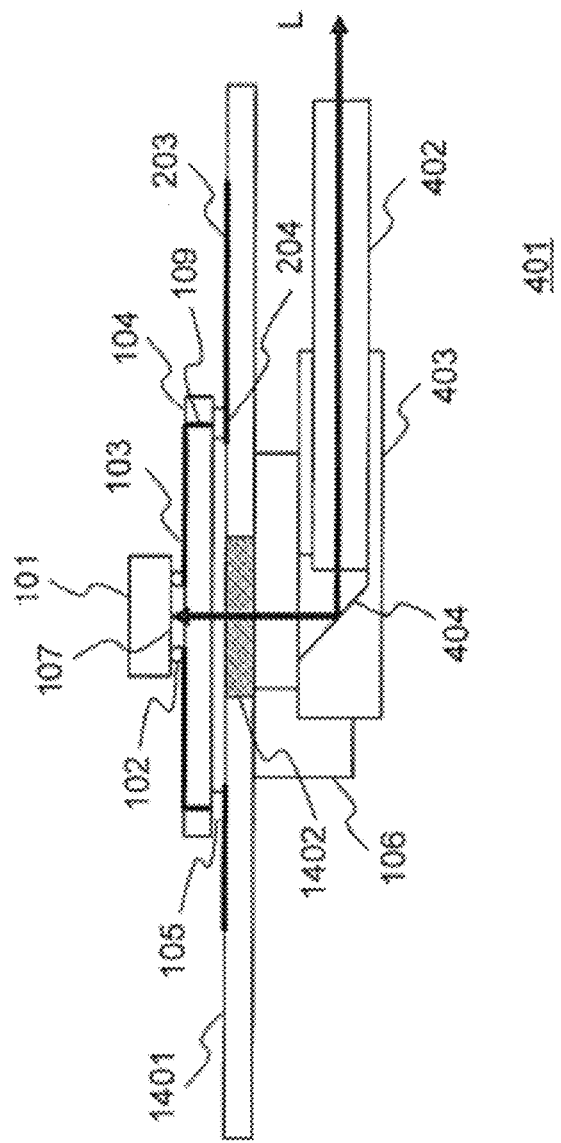

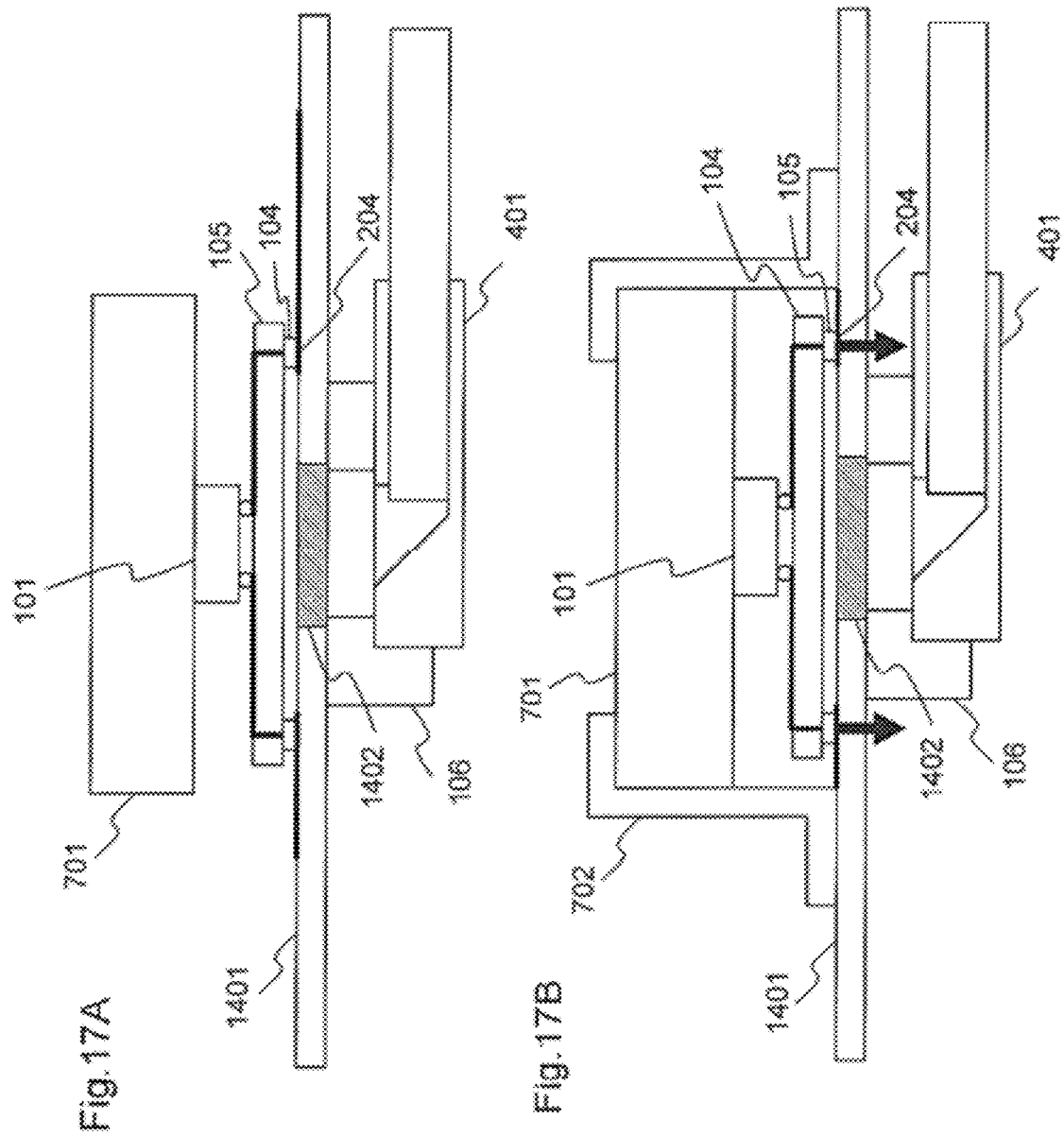

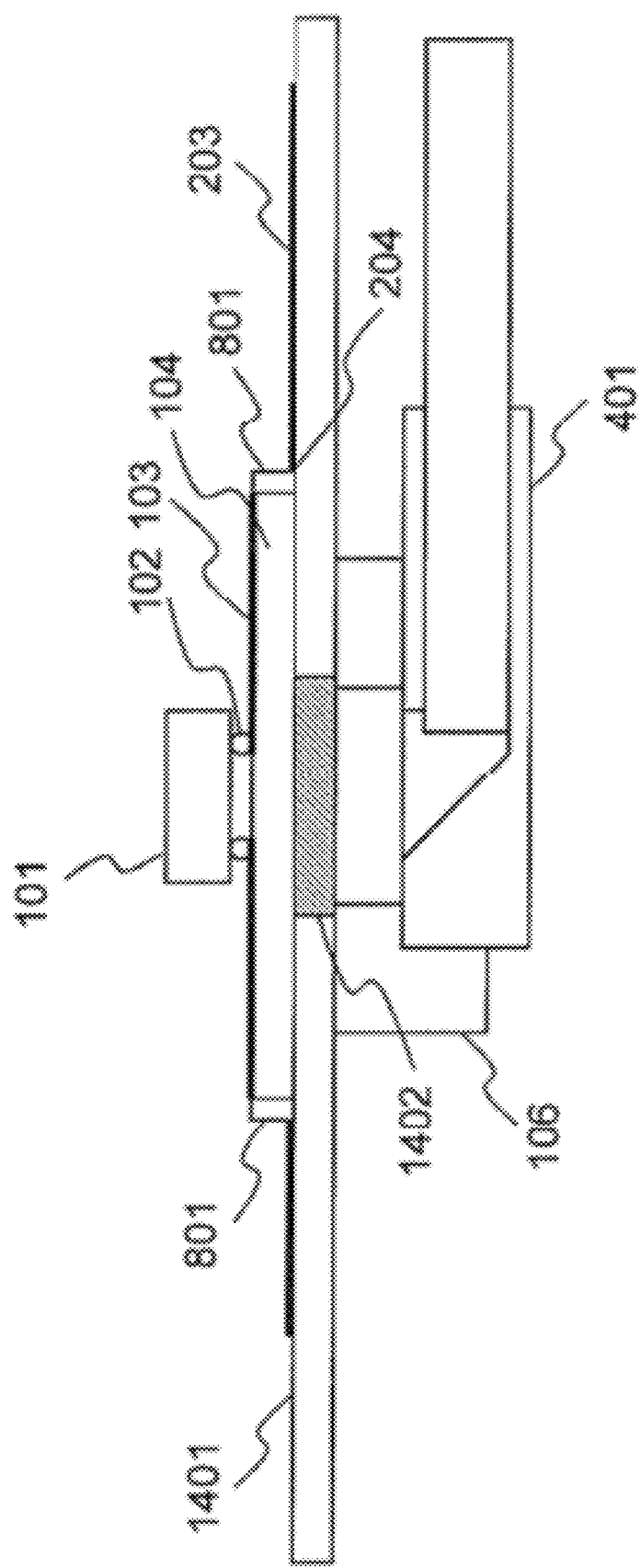

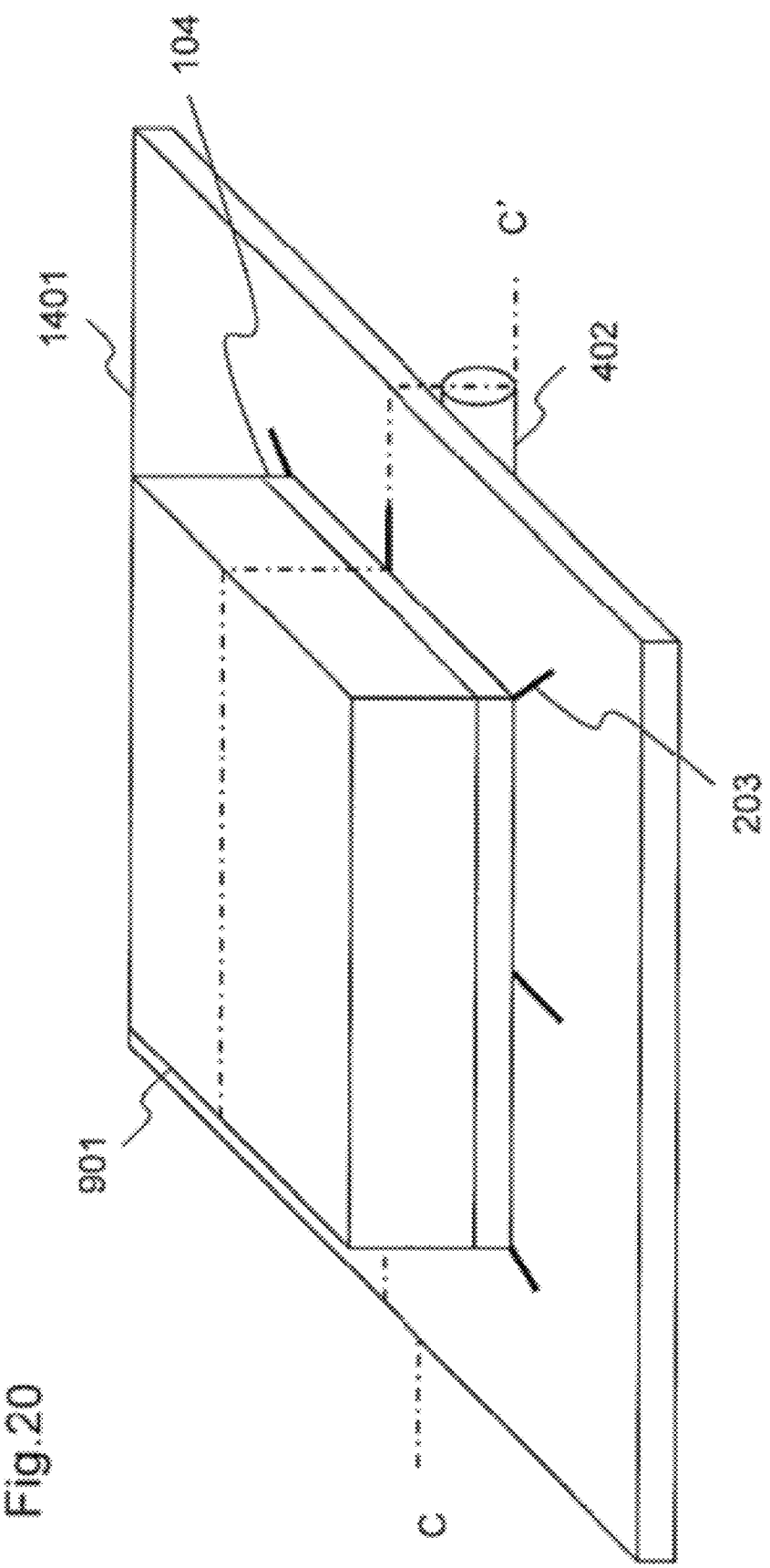

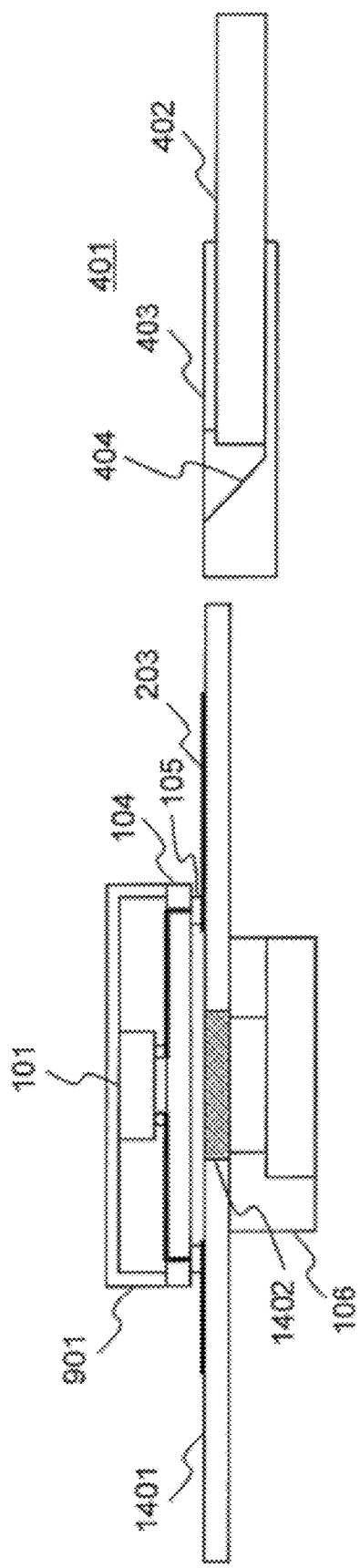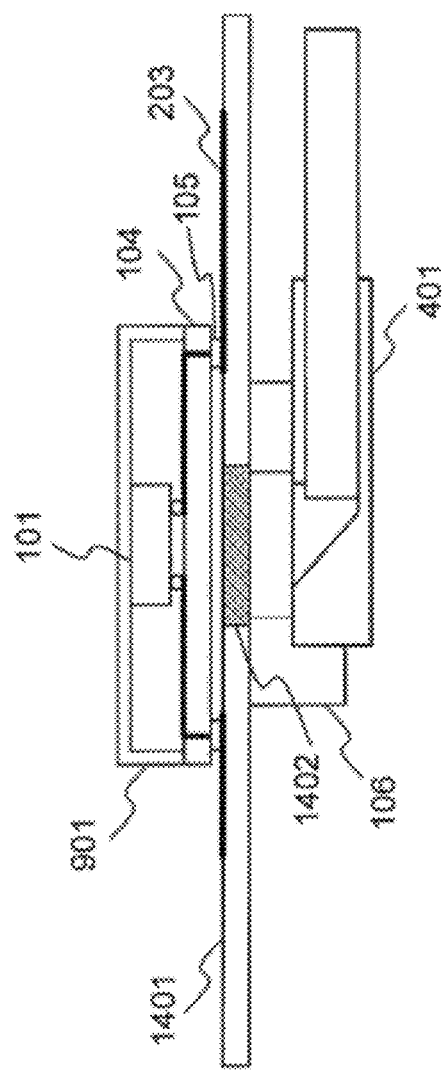

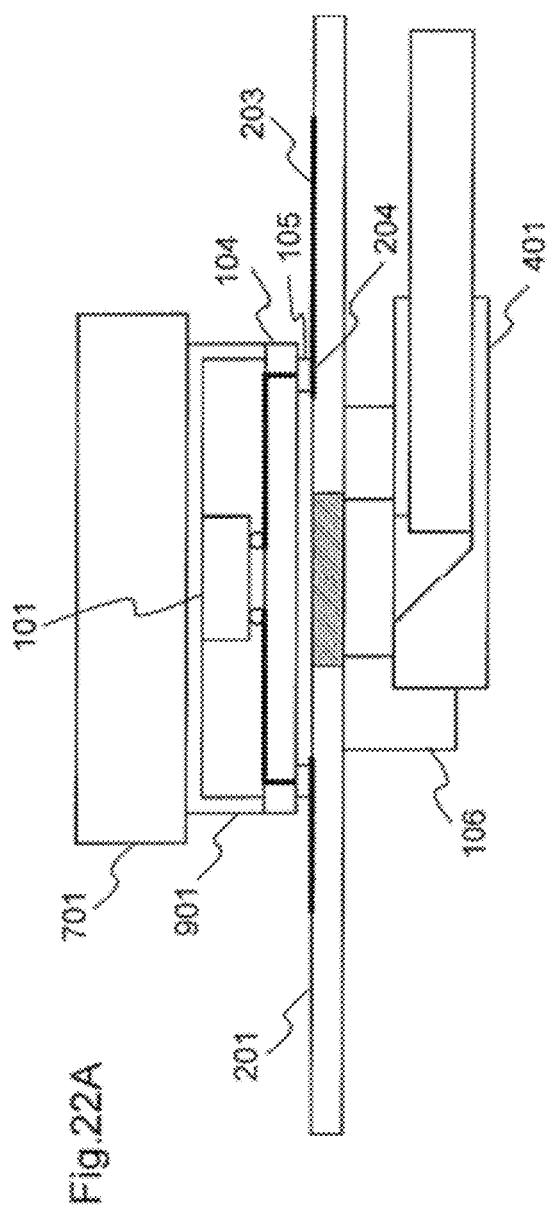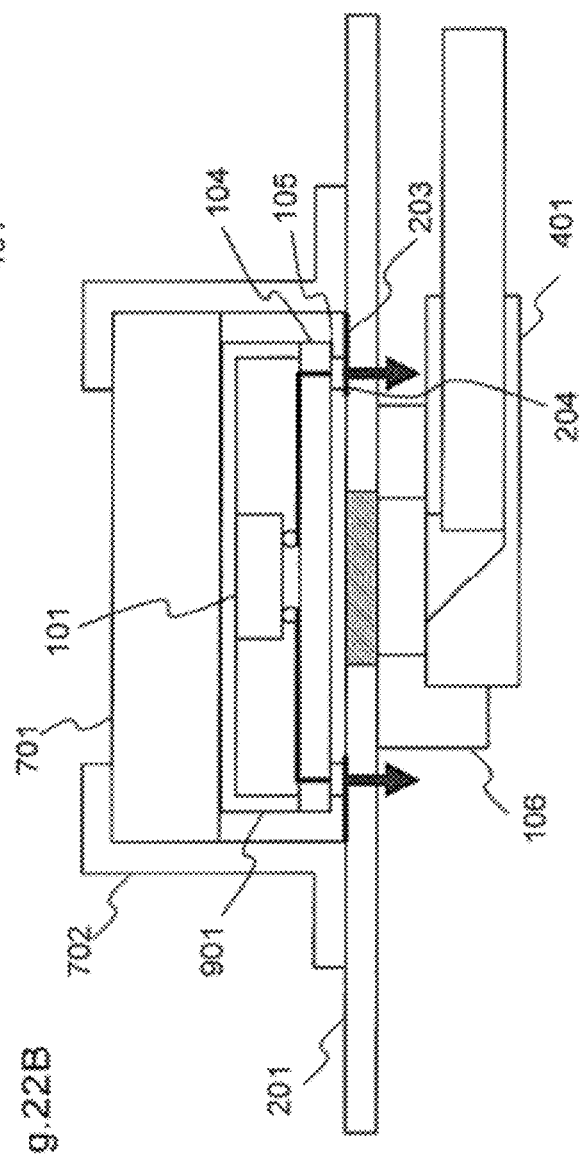

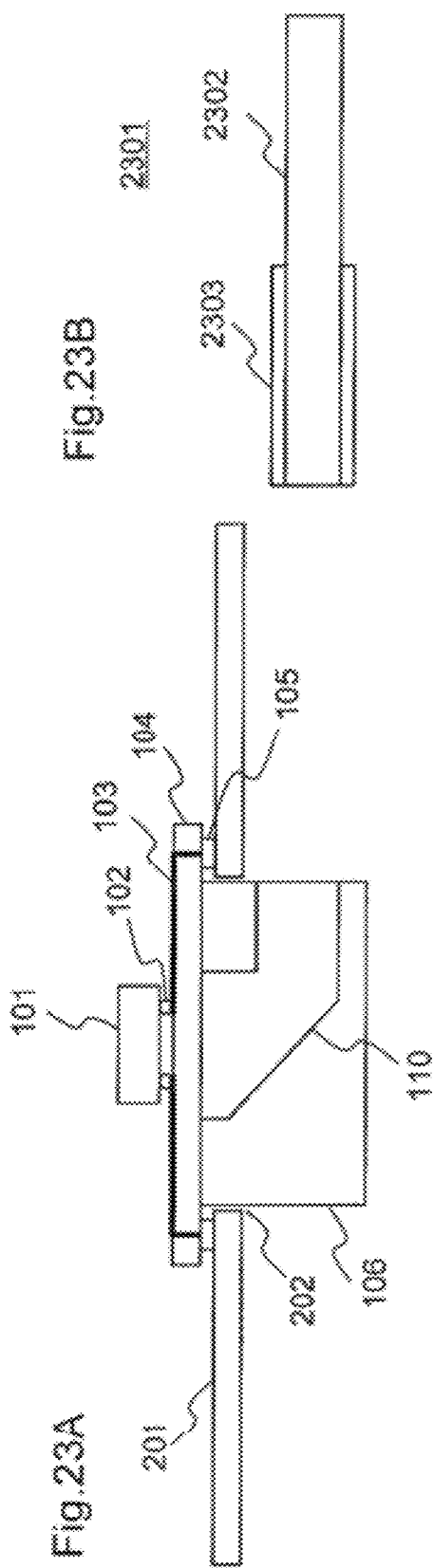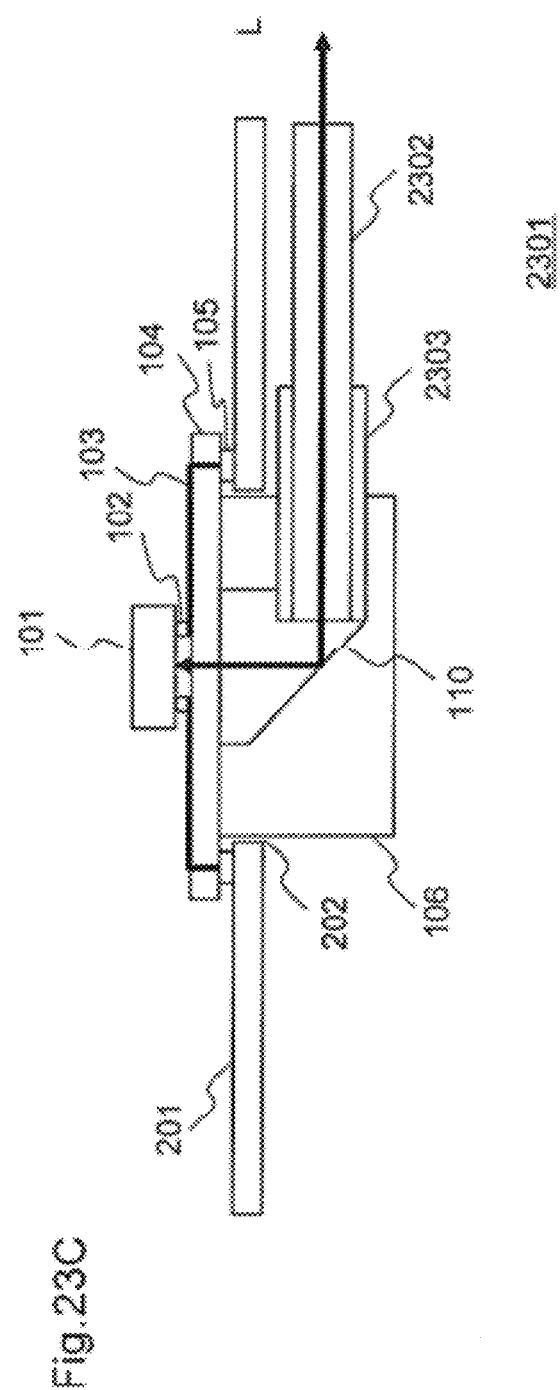

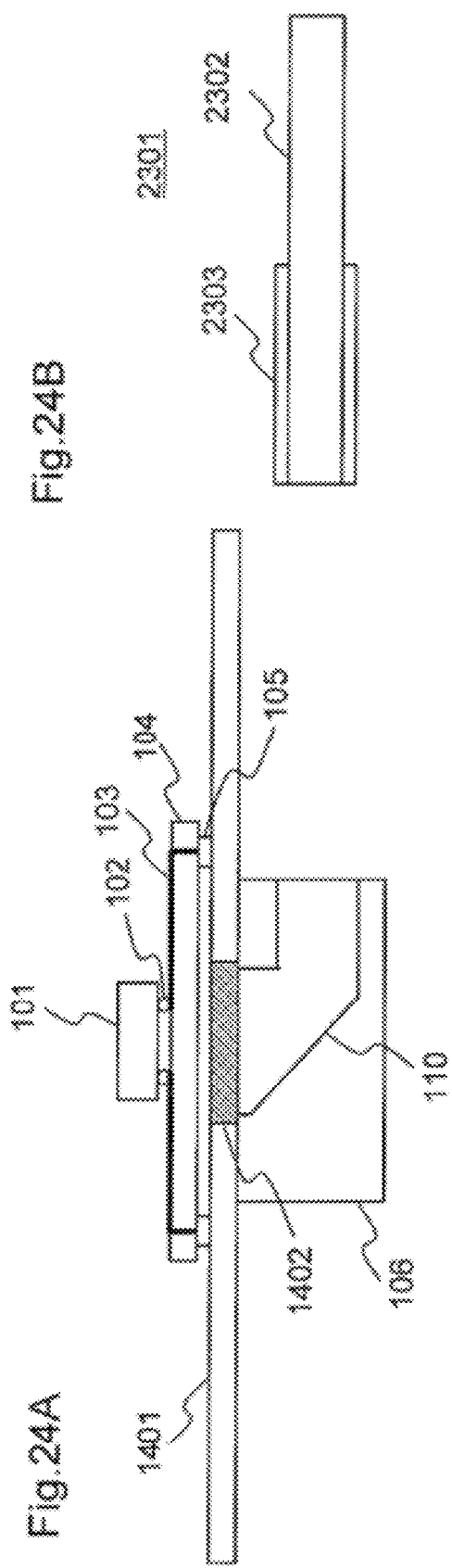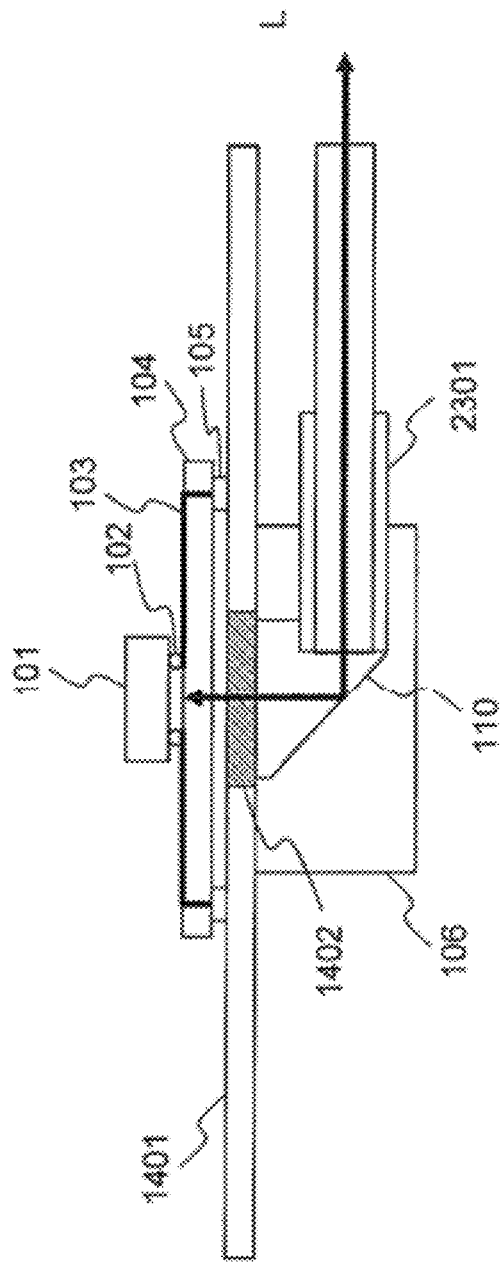

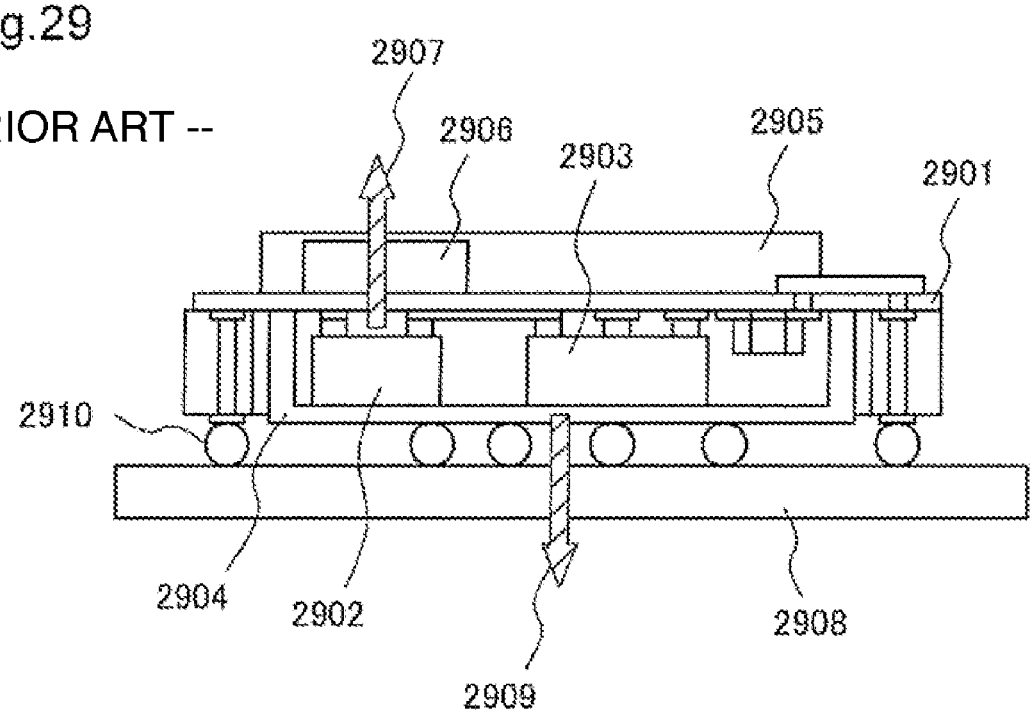

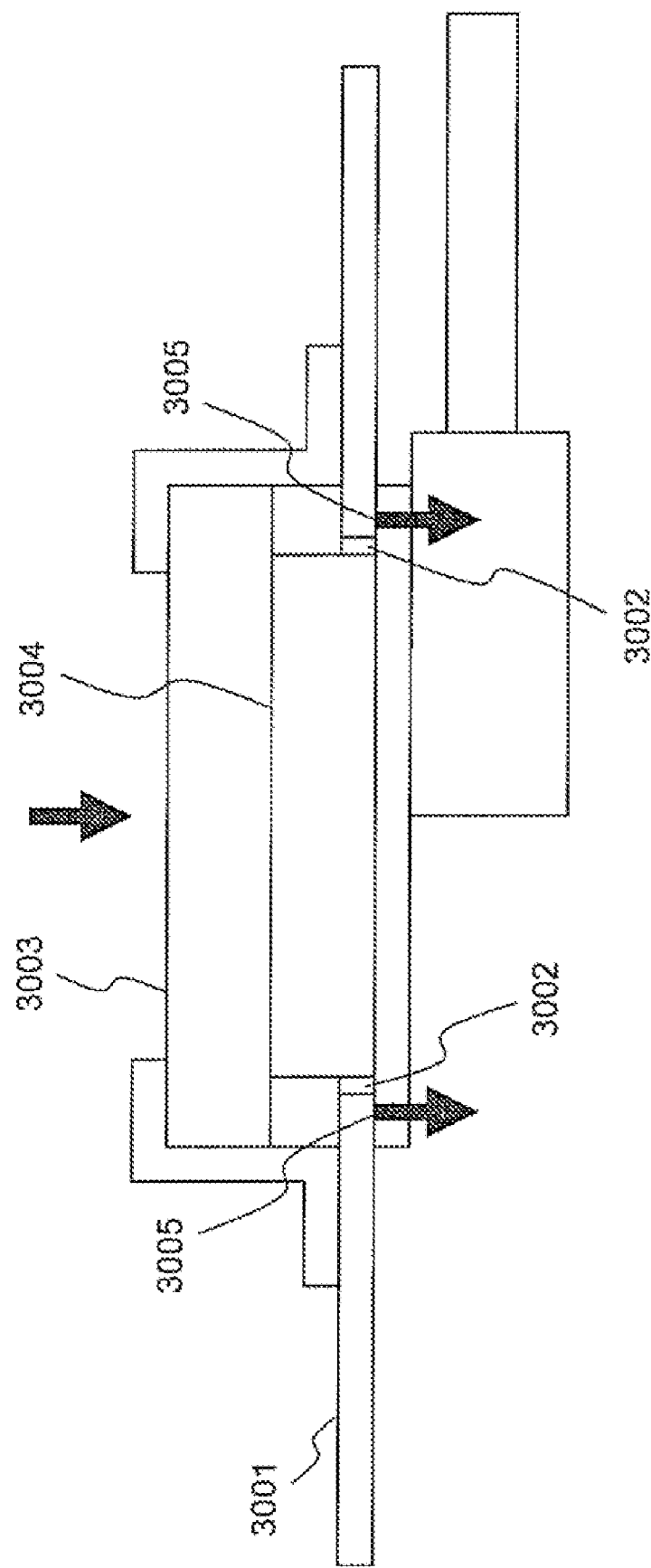
Fig. 30 -- PRIOR ART --

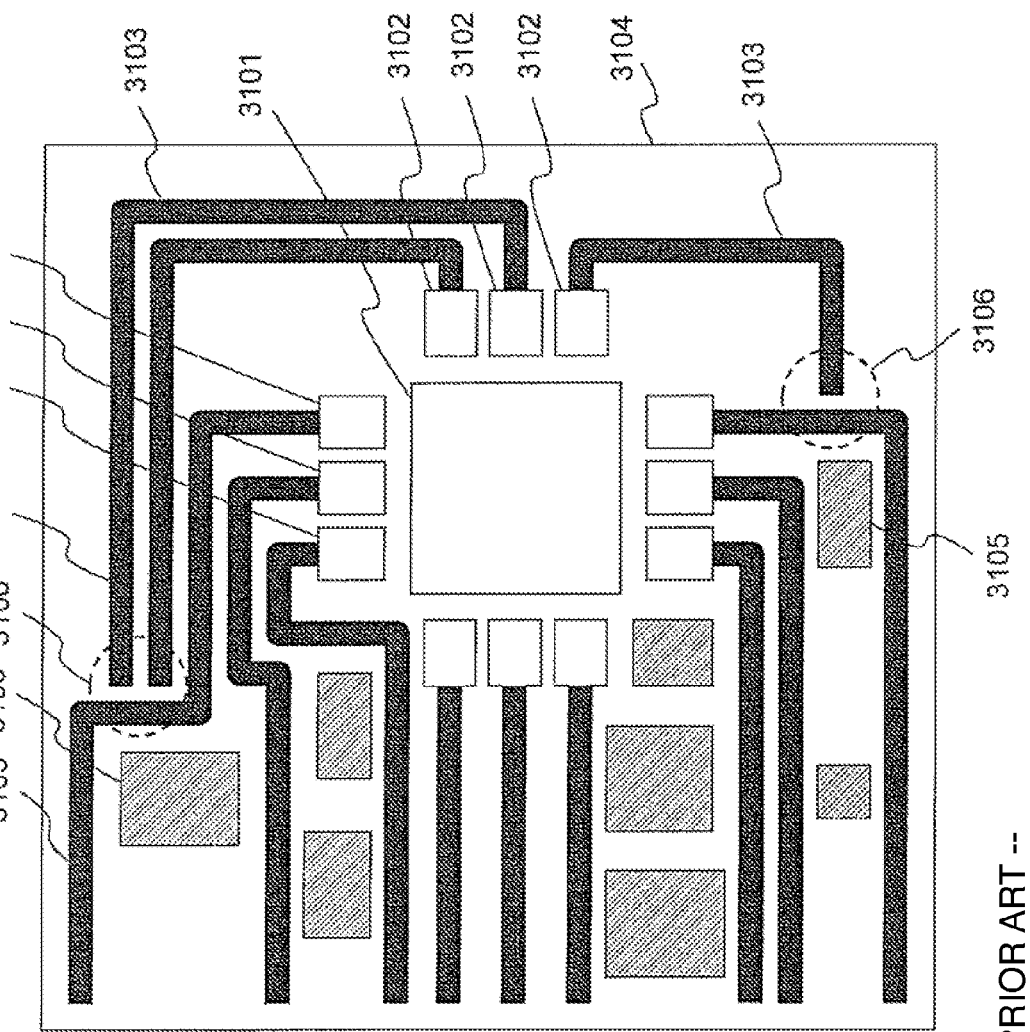
Fig.31  -- PRIOR ART --

MOUNTING OF OPTICAL DEVICE ON MOUNTING BOARD TO AT LEAST PROVIDE HEAT RADIATION

This application is based upon and claims the benefit of priority from Japanese Patent Application No. 2008-231693, filed on Sep. 10, 2008, the disclosure of which is incorporated herein in its entirety by reference.

TECHNICAL FIELD

The present invention relates to an optical module and an optical transmission method and, more particularly, to an optical module and an optical transmission method which improve heat radiation performance and facilitate laying of an optical fiber for inputting and outputting light.

BACKGROUND ART

The speed of input/output signals of a CPU (Central Processing Unit) incorporated in a computer is getting higher along with improving performance of a computer. Therefore, avoiding the attenuation of a high speed signal propagating on a circuit board is an issue to be addressed. In order to cope with this issue, consideration about a method to input and output a high speed signal of a CPU using a photoelectric conversion module (hereinafter, referred to as "optical module") is progressing in recent years. An optical module has a function to convert an electric signal and an optical signal from one into the other or in a mutual manner. In measures against the attenuation of a high speed signal using an optical module, the feature that the attenuation of a light signal is smaller than that of an electric signal is utilized. That is, in part of the entire signal line through which a high-speed input/output electric signal is transmitted, converting an electric signal into a light signal using an optical module to transmit the light signal suppresses the attenuation of a high speed signal on a circuit board.

In order to improve the effect obtained by converting a high-speed electric signal of a CPU into a light signal to transmit the light signal, the attenuation of an electric signal on a circuit board needs to be decreased as much as possible. Accordingly, it is required that the length of sections of a circuit board where a transmitted signal propagates as an electric signal is reduced as short as possible. An optical module needs to be mounted near the CPU as close as possible. The number of input/output signals of the CPU reaches several hundreds to several thousands in a super computer. Therefore, a large number of very small optical modules are needed to be mounted in high density on a circuit board.

An optical module which receives and outputs light in a direction parallel to a circuit board is disclosed in Japanese Patent Application Laid-Open No. 2008-41770 (hereinafter, referred to as patent document 1). In this optical module, an optical fiber is taken out from a side surface of the module in a direction parallel to a circuit board onto which the optical module is mounted.

An optical module which receives and outputs light in a direction vertical to a circuit board is disclosed in Japanese Patent Application Laid-Open No. 2008-34622 (hereinafter, referred to as patent document 2). This optical module is mounted on a circuit board with an opening. Light from a light emitting device in an optical module is radiated vertically to a circuit board in the direction of the rear surface of the circuit board through the opening.

In I. Hatakeyama, et al.: "Optical Module Technology for High-speed Interconnections-System LSI Module with Optical I/O Interfaces", OPTRONICS Magazine, No. 277, p. 184 (Jan. 10, 2005), an optical module which receives and outputs light in a direction vertical to a circuit board is also described (hereinafter, referred to as "non-patent document"). FIG. 29 is a sectional view showing the structure of the optical module disclosed in the non-patent document. In this module, an optical device 2902 and an optical device driver IC 2903 are mounted onto a transparent resin board 2901. The optical device 2902 and the optical device driver IC 2903 are covered with a metal casing 2904. A lens supporter 2905 is joined to the surface of the transparent resin board 2901 opposite to the surface onto which the optical device 2902 is mounted. A flat-plate micro lens array 2906 is incorporated in the lens supporter 2905. A light signal 2907 emitted or received by the optical device 2902 is outputted or inputted between the outside and the inside of the optical module via the flat-plate micro lens array 2906. The light signal 2907 is inputted or outputted between the outside and the inside of the optical module by connecting an optical fiber optically.

SUMMARY

An exemplary object of the invention is to provide an optical module and an optical transmission method which are capable of installing a transmission path for inputting/outputting light, suitable for high-speed signal input/output, and excellent in heat radiation performance and mounting reliability.

An optical module according to an aspect of the present invention includes: an optical device mounting board including a first surface, a second surface on a reverse side of the first surface, and a first light transparent part allowing an emitted light traveling in a direction from the first surface to the second surface and a received light traveling in a direction from the second surface to the first surface to pass through the first transparent part; an optical device mounted on the first surface, which is a light emitting device emitting the emitted light or a light receiving device receiving the received light; a first terminal mounted on a surface except the first surface of the optical device mounting board; a wiring connecting a second terminal of a component mounted on the first surface including the optical device with the first terminal; and a transmission medium connector connecting a light transmission medium transmitting the emitted light traveling in a direction from the second surface to an outside of the optical module or the received light traveling in a direction from the outside to the second surface.

An optical transmission method according to another aspect of the present invention includes: mounting an optical device which is a light emitting device emitting an emitted light or a light receiving device receiving a received light on a first surface of an optical device mounting board including the first surface, a second surface on a reverse side of the first surface, and a first light transparent part allowing the emitted light traveling in a direction from the first surface to the second surface and the received light traveling in a direction from the second surface to the first surface to pass through the first transparent part; connecting a first terminal mounted on a surface except the first surface of the optical device mounting board with a second terminal of a component mounted on the first surface including the optical device; transmitting an electric signal through the first terminal joined or contacted with a circuit wiring on a mounting surface of a mounting board; and transmitting the emitted light traveling in a direction from the second surface to an outside or the received light traveling in a direction from the outside to the second surface through a light transmission medium connected from a side of a rear surface of the mounting surface to the second surface.

BRIEF DESCRIPTION OF THE DRAWINGS

Exemplary features and advantages of the present invention will become apparent from the following detailed description when taken with the accompanying drawings in which:

FIG. 3 is a perspective view showing the configuration of mounting of an optical module of the first exemplary embodiment onto a circuit board;

FIG. 4A, FIG. 4B and FIG. 4C are sectional views showing the mounting configuration of an optical module of the first exemplary embodiment onto a circuit board;

FIG. 5A, FIG. 5B and FIG. 5C are sectional views showing the mounting configuration of an optical module of the first exemplary embodiment onto another circuit board;

FIG. 6 is a sectional view showing the mounting configuration of an optical module of the first exemplary embodiment onto another circuit board;

FIG. 7A and FIG. 7B are sectional views of an optical module of the first exemplary embodiment on which a heat sink is attached;

FIG. 9A is a top view showing the structure of an optical module of a second exemplary embodiment;

FIG. 9B is a bottom view showing the structure of an optical module of the second exemplary embodiment;

FIG. 9C and FIG. 9D are sectional views showing the structure of an optical module of the second exemplary embodiment;

FIG. 11A, FIG. 11B and FIG. 11C are sectional views showing the mounting configuration of an optical module of the second exemplary embodiment onto a circuit board;

FIG. 16A, FIG. 16B and FIG. 16C are sectional views showing the mounting configuration of an optical module of the third exemplary embodiment onto a circuit board;

FIG. 17A and FIG. 17B are sectional views of an optical module of the third exemplary embodiment on which a heat sink is attached;

FIG. 18 is a sectional view of an optical module of the third exemplary embodiment with a terminal of different structure;

FIG. 20 is a perspective view showing the mounting configuration of an optical module of the third exemplary embodiment to which a case is added onto a circuit board;

FIG. 21A, FIG. 21B and FIG. 21C are sectional views showing the mounting configuration of an optical module of the third exemplary embodiment to which a case is added onto a circuit board;

FIG. 22A and FIG. 22B are sectional views of an optical module of the third exemplary embodiment to which a case and a heat sink are added;

FIG. 23A, FIG. 23B and FIG. 23C are sectional views showing the connection configuration of an optical module and a light transmission medium of a fourth exemplary embodiment;

FIG. 24A, FIG. 24B and FIG. 24C are sectional views showing the connection configuration of an optical module and a light transmission medium of the fourth exemplary embodiment;

FIG. 29 is a sectional view showing the structure of an optical module disclosed in the non-patent document;

FIG. 30 is a sectional view showing the mounting configuration of an optical module of patent document 1;

FIG. 31 is a top view showing the mounting configuration of an optical module of patent document 1 onto a circuit board.

EXEMPLARY EMBODIMENT

Exemplary embodiments of the present invention will now be described in detail in accordance with the accompanying drawings.

1. First Exemplary Embodiment

Figure 1B:
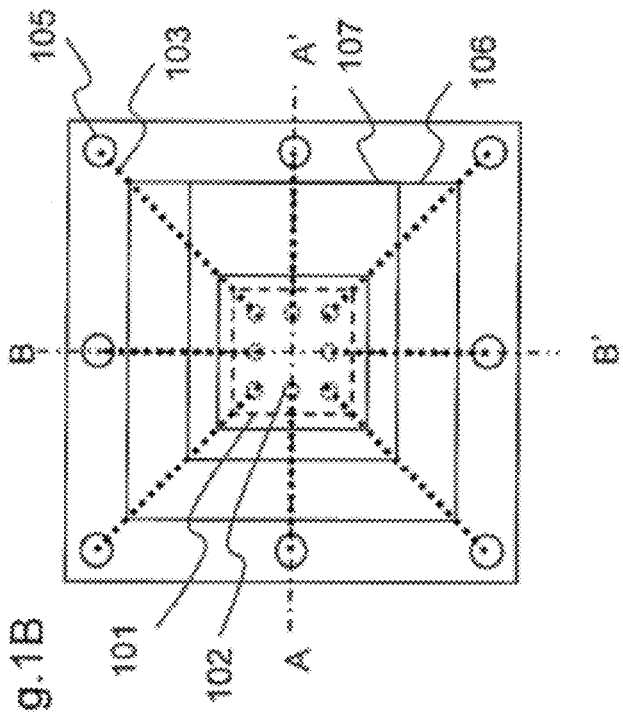
FIG. 1B is a bottom view showing the structure of an optical module of the first exemplary embodiment.
Figure 1D:
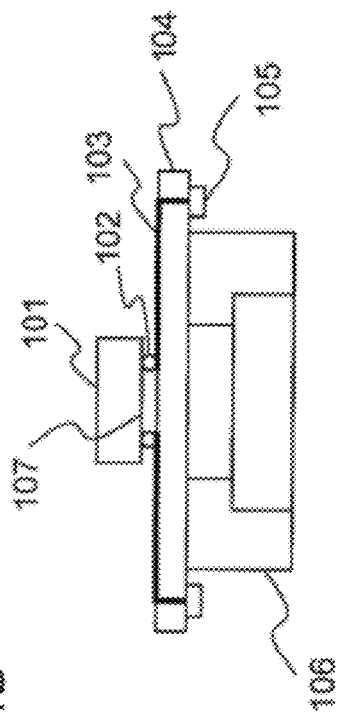
FIG. 1C and FIG. 1D are sectional views showing the structure of an optical module of the first exemplary embodiment.
Figure 1A:
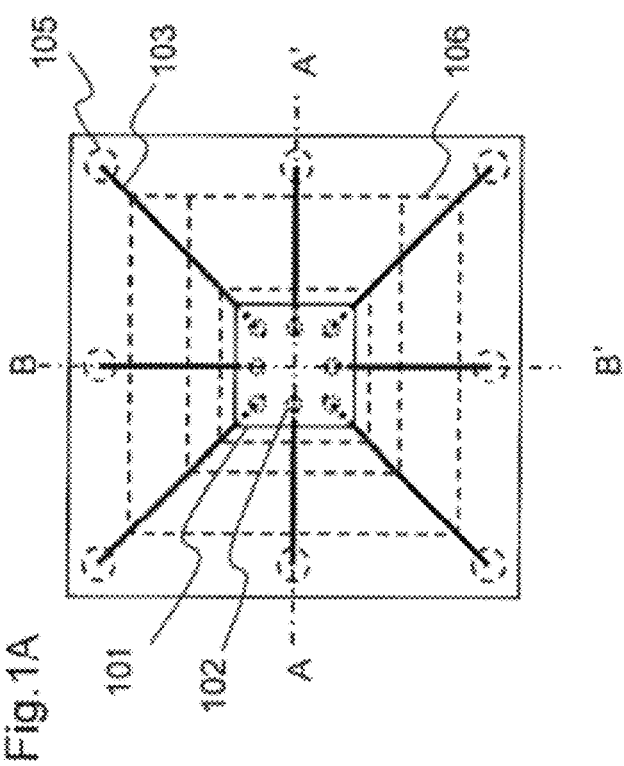
FIG. 1A is a top view showing the structure of an optical module of a first exemplary embodiment.
Figure 1C:
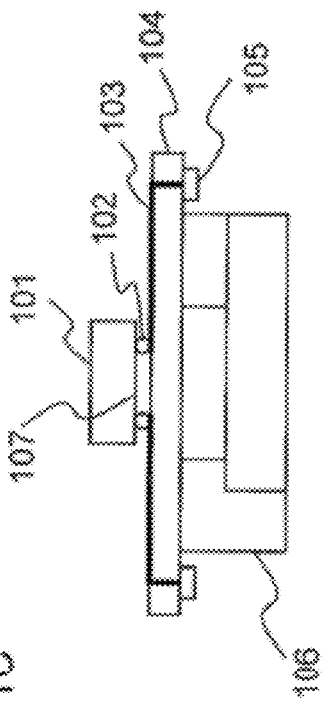
Figure 2:
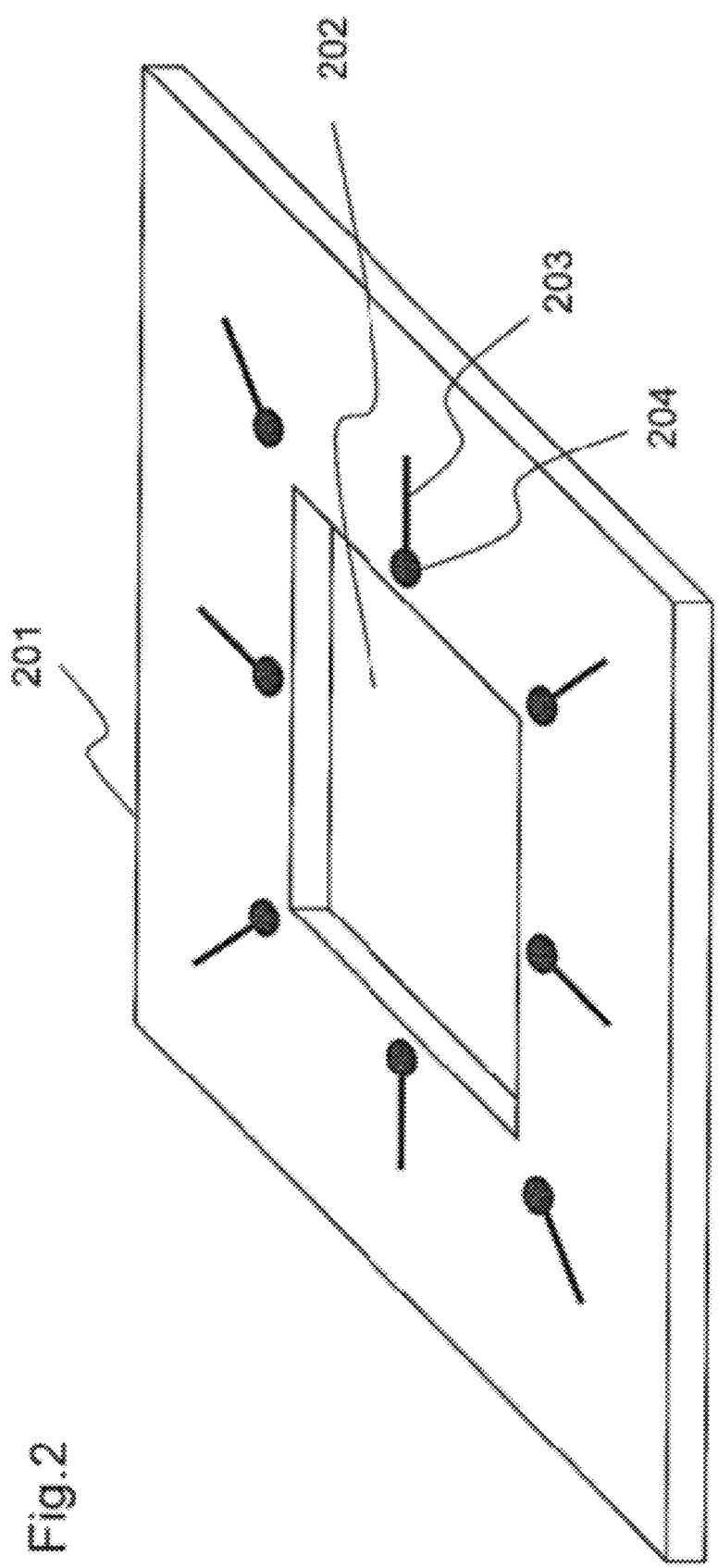
FIG. 2 is a perspective view of a circuit board on which an optical module of the first exemplary embodiment is mounted.
Figure 8:
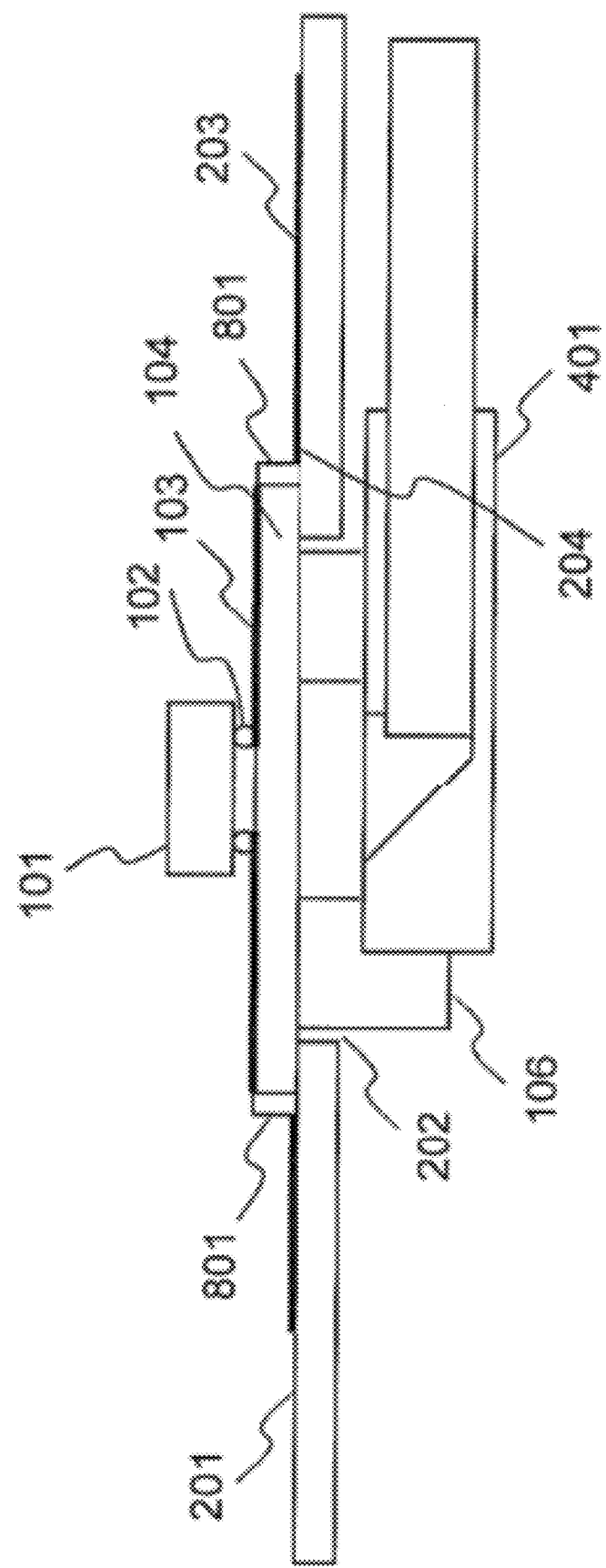
FIG. 8 is a sectional view of an optical module of the first exemplary embodiment with a terminal of different structure.

Embodiments of the present invention will be described in detail referring to the drawings. FIG. 1A and FIG. 1B are a top view and a bottom view showing the structure of an optical module of the first exemplary embodiment of the present invention. FIG. 1C and FIG. 1D are sectional views showing the structure of the optical module of the first exemplary embodiment. FIG. 1C is a sectional view of the optical module of the first exemplary embodiment taken along line A-A' of FIG. 1A and FIG. 1B. FIG. 1D is a sectional view of the optical module of the first exemplary embodiment taken along line B-B'. FIG. 2 is a perspective view of a circuit board on which the optical module of the first exemplary embodiment is mounted. FIG. 3 is a perspective view showing the mounting configuration of the optical module of the first exemplary embodiment onto a circuit board. FIG. 4A, FIG. 4B and FIG. 4C are sectional views showing the mounting configuration of the optical module of the first exemplary embodiment onto a circuit board. FIG. 5A, FIG. 5B, FIG. 5C and FIG. 6 are sectional views showing the mounting configuration of the optical module of the first exemplary embodiment onto a different circuit board. FIG. 7A and FIG. 7B are sectional views of the optical module of the first exemplary embodiment on which a heat sink is installed. FIG. 8 is a sectional view of the optical module of the first exemplary embodiment with a terminal of different structure.

The structure of the optical module of the first exemplary embodiment will be described with reference to FIG. 1A, FIG. 1B, FIG. 1C and FIG. 1D.

The optical module of the first exemplary embodiment includes an optical device 101, an device electrode 102, an internal wiring 103, an optical device mounting substrate 104, a module terminal 105 and a transmission medium connector 106.

The optical device 101 is mounted on a surface of the optical device mounting substrate 104. The optical device 101 is a light emitting device or a light receiving device. When the optical device 101 is a light emitting device, light is emitted from a light receiving/emitting surface 107, and when the optical device 101 is a light receiving device, light which enters the light receiving/emitting surface 107 is received. The optical device 101 is provided with the device electrode 102 on the same face as the light receiving/emitting surface 107. The device electrode 102 is joined to the surface of the optical device mounting substrate 104 of the optical device 101. Thus, the optical device 101 is mounted on the optical device mounting substrate 104 such that the light receiving/emitting surface 107 faces the optical device mounting substrate 104. As an exemplary mounting method of the optical device 101 to the optical device mounting substrate 104, there is a method using "flip-chip technology".

The optical device mounting substrate 104 allows emitted light from the optical device 101 or incident light to the optical device 101 to pass through the optical device mounting substrate 104. Here, the term "to allow light to pass through" means that the optical device mounting substrate 104 allows light to pass through the optical device mounting substrate 104 such that a transmittance of light requested as the whole optical transmission path between the optical device 101 and an optical device of an optical communication destination is no smaller than a predetermined numerical value. Accordingly, the transmittance of the optical device mounting substrate 104 by itself is not specified specifically. In short, the transmittance of a whole optical transmission path including the optical device mounting substrate 104 and light transmission media such as an optical fiber has only to meet a required condition. Hereinafter, the state in which light pass through in such meaning is called "transparent" simply. As mentioned above, the optical device mounting substrate 104 allows emitted light from the optical device 101 or incident light to the optical device 101 to pass through the optical device mounting substrate 104. Therefore, the optical device mounting substrate 104 is made of a transparent material. Further, the optical device mounting substrate 104 does not need to be transparent as a whole and a part through which emitted light or incident light passes only have to be transparent.

The module terminal 105 is provided on the rear surface of the optical device mounting substrate 104 opposite to the surface on which the optical device 101 is mounted. The module terminal 105 is connected with the device electrode 102 by the internal wiring 103. Meanwhile, a device besides the optical device 101 such as a device for driving the optical device 101 or the like may be connected to the optical module terminal 105 using the internal wiring 103. When a device other than the optical device 101 is connected to the optical module terminal 105, an electrode provided in that device and the optical module terminal 105 are connected.

Hereinafter, the portion including the optical device 101, the internal wiring 103, the optical device mounting substrate 104 and the module terminal 105 is called "an optical module main body".

In an optical module of the first exemplary embodiment, the transmission medium connector 106 is joined to the optical module main body. Specifically, the transmission medium connector 106 is joined to the optical device mounting substrate 104 of the optical module main body. The transmission medium connector 106 includes a hollow structure, and light can pass through the inside of the transmission medium connector 106.

An optical module of the first exemplary embodiment is mounted on a circuit board 201 with an opening 202 as shown in FIG. 2. Other elements besides the optical module may be mounted on the circuit board 201. Circuit wiring 203 and a land 204 to which an optical module is connected are provided on the upper surface of the circuit board 201. The optical module and other element (not illustrated) on the circuit board 201 such as a CPU, for example, are connected to the circuit wiring 203. The opening 202 is of a size that the transmission medium connector 106 can be inserted and the module terminal 105 and the land 204 can be joined.

The mounting configuration of the optical module will be described with reference to FIG. 3, FIG. 4A, FIG. 4B and FIG. 4C. FIG. 3 is a perspective view when the optical module is mounted on a circuit board. FIG. 4A and FIG. 4C are sectional views of the optical module taken along line C-C' of FIG. 3. FIG. 4B is a sectional view of an optical connection medium connected to the optical module.

As shown in FIG. 3 and FIG. 4A, an optical module main body is mounted onto the upper surface of the circuit board 201. The transmission medium connector 106 can be inserted in the opening 202 of the circuit board 201, because the opening 202 has the above-mentioned size. The optical module terminal 105 and the land 204 are joined, and consequently the optical module main body is fixed on the circuit board 201. Because the optical device 101 and the circuit wiring 203 are connected electrically at this moment, the optical device 101 can input and output signals from and to the outside of the optical module. Alternatively, an optical module main body may be pressed against the circuit board 201 using a predetermined fixing member without joining the optical module terminal 105 and the land 204. In this case, the module terminal 105 and the circuit wiring 203 are not necessary to be joined, but should simply be contacted.

Next, a connection configuration of a light transmission medium to an optical module will be described with reference to FIG. 4B and FIG. 4C. A light transmission medium 401 to be connected to the transmission medium connector 106 is shown in FIG. 4B. A light transmission medium 401 includes an optical fiber 402 and an optical connector 403. A reflector plate 404 which reflects light is provided inside the optical connector 403. The reflector plate 404 changes the direction of travel of light between the optical module and the optical fiber 402.

As shown in FIG. 4C, the light transmission medium 401 is connected to the transmission medium connector 106 using the optical connector 403. Light inputted and outputted between the optical device 101 and the optical fiber 402 (hereinafter, referred to as "input/output light") passes through inside the optical device mounting substrate 104, the opening 202 and the transmission medium connector 106. On this occasion, input/output light progresses as shown by arrow L, with the direction of travel being changed by the reflector plate 404 inside the optical connector 403.

Thus, in the optical module of the first exemplary embodiment, the optical fiber 402 can be arranged in an area in a side of the circuit board 201 opposite to that of the optical module main body, and furthermore, in parallel to the circuit board 201. The circuit wiring 203 is formed on a surface of the circuit board 201 on which the optical module main body is mounted, and thus other elements and parts connected with the optical module are often mounted on this face. Even in such cases, because the optical fiber 402 does not interfere with those elements and parts, it is easy to lay the optical fiber.

An apparatus in which the optical module and a circuit board 201 are integrated as shown in FIG. 4A is a kind of an optical transmission apparatus. That is, as shown in FIG. 4C, this transmission apparatus can input and output a light signal from and to the outside by being connected with the light transmission medium 401. Also, this transmission apparatus can input and output an electric signal between the optical module and the outside via the circuit wiring 203.

Meanwhile, as shown in FIG. 4A, the transmission medium connector 106 extends entirely through the circuit board 201. However, the transmission medium connector 106 does not have to extend entirely through the circuit board 201. FIG. 5C is a sectional view when an optical module is mounted on a circuit board 501 with a larger thickness than that of the circuit board 201. As shown in FIG. 5A, because the thickness of the circuit board 501 is larger than that of the circuit board 201, the transmission medium connector 106 does not extend entirely through the circuit board 501. An optical connector 503 of a light transmission medium 502 in this case has a shape which allows the optical connector 503 to be inserted in an opening 504 as shown in FIG. 5B.

Thus, a medium connection face 108 only has to be able to be connected with a light transmission medium 502 or the light transmission medium 401. Therefore, the medium connection face 108 may be located at a position inside the opening 504 which is more retracted than a circuit board under surface 505 as shown in FIG. 5A.

Part of the interior surface of the opening 202 shown in FIG. 2 and the exterior surface of the transmission medium connector 106 may make contact with each other. In this case, an optical module can be easily positioned at the position where the optical module is mounted on the circuit board 201. Further, the shape of the interior surface of the opening 202 may be equal to the shape of the exterior surface of the transmission medium connector 106, thus the whole side faces of them make contact with each other. FIG. 6 is a sectional view showing the mounting configuration where a light transmission medium is laid on a circuit board in which the shape of the interior surface of an opening is equal to the shape of the exterior surface of a transmission medium connector. Thus, because the interior surface of the opening (not illustrated) touches the exterior surface of the transmission medium connector 106 completely, the adjustment for positioning to the position at which an optical module is mounted on a circuit board 601 is not needed.

When the optical device 101 operates, the optical device 101 consumes electric power and generates heat. The side faces and the upper surface of the optical device 101 in FIG. 4C are exposed to air. As a result, the heat is radiated into air efficiently to cool the optical module. When other devices are also mounted onto the optical device mounting substrate 104, the devices may also generate heat. In this case, heat which the devices mounted on the optical device mounting substrate 104 generate is radiated to the outside similarly.

In order to improve heat radiation performance, a heat sink 701 may be installed on the upper surface of the optical device 101 as shown in FIG. 7A. As shown in FIG. 7B, in order to reduce thermal resistance between the heat sink 701 and the optical device 101, the heat sink 701 may be pressed against the circuit board 201 using a pressing member 702. The pressing member 702 should simply be fixed on a predetermined area provided on the circuit board 201 with a screw or the like. The pressing member 702 may be formed using an elastic body such as a leaf spring so that the heat sink 701 will be pressed against the circuit board by elastic force of the pressing member 702.

In the optical module of the first exemplary embodiment, there is also a specific feature in the mounting configuration of the optical device 101. As shown in FIG. 4A, the optical device 101 is mounted on the optical device mounting substrate 104 so that the light receiving/emitting surface 107 may face the optical device mounting substrate 104. The module terminal 105 is provided on the same surface as the light receiving/emitting surface 107. Accordingly, the wiring length between the optical device 101 and the module terminal 105 is shortest. Therefore, the optical module of the first exemplary embodiment is better suited for ultrahigh-speed operation.

As shown in FIG. 4A, the optical module of the first exemplary embodiment has the module terminal 105 in a lower part of the optical module main body. Therefore, the distance between the circuit wiring 203 and the internal wiring 103 is also shortest. Portions between the circuit wiring 203 and the internal wiring 103 where a signal wire bends are at only both ends of a through part 109 of the optical device mounting substrate 104 near the module terminal 105. Therefore, this optical module suits transmission of an ultrahigh-speed signal, because signal attenuation and reflection between the circuit wiring 203 and the internal wiring 103 is suppressed.

In addition, as shown in FIG. 7B, when the heat sink 701 is pressed, stress is added in a direction where the module terminal 105 is pressed against the land 204. Accordingly, a reliability problem of mounting between the module terminal 105 and the land 204 does not occur.

As mentioned above, the module terminal 105 provided on a lower part of the optical module main body has effects of supporting ultrahigh-speed operation and improving mounting reliability. A module terminal may be provided on a side face of the optical module main body in order to improve performance for supporting ultrahigh-speed operation and mounting reliability. FIG. 8 is a sectional view of an optical module with a module terminal on a side face. A module terminal 801 is provided on a side face of the optical device mounting substrate 104. In this case, the distance between the circuit wiring 203 and the internal wiring 103 is also shortest. Portions where a signal wire bends between the circuit wiring 203 and the internal wiring 103 are at only both ends of the module terminal 801. Therefore, this optical module is suited for transmission of an ultrahigh-speed signal, because signal attenuation and reflection between the circuit wiring 203 and the internal wiring 103 is suppressed.

As described above, in the optical module of the first exemplary embodiment, an optical fiber extends from the surface contrary to the side of the optical module main body. As a result, there is an effect that installation of an optical fiber is easy because the optical fiber does not interfere with other parts.

In the optical device of the first exemplary embodiment, the upper surface of the optical module is opened. Therefore, the optical module has an effect that it is excellent in heat radiation performance. Further, because a heat sink is easy to be installed, heat radiation performance can be improved more.

The chip of an optical device is mounted with the light receiving/emitting surface turned to an optical device mounting substrate. In addition, the optical device mounting substrate is close to a circuit board. Accordingly, the wiring length between the optical device and module terminal is shortest. Therefore, the optical module suits ultrahigh-speed operation.

Also, because a module terminal is provided on a lower part or a side face of the optical module main body, there are a few bends of a signal wire. Therefore, this optical module suits ultrahigh-speed operation. When the optical module is pressed in the circuit board direction, a force in the direction to press the module terminal against the circuit board is added. Accordingly, the optical module has also an effect that a mounting reliability problem does not occur.

A circuit board on which the optical module of the first exemplary embodiment is mounted only has to have an opening. Therefore, the optical module has an effect that manufacturing of the circuit board on which the optical module is mounted is easy. Further, the opening of a circuit board may make contact with a transmission medium connector. In this case, the optical module has an effect that positioning when the optical module is mounted is easy.

2. Second Exemplary Embodiment

Figure 10:
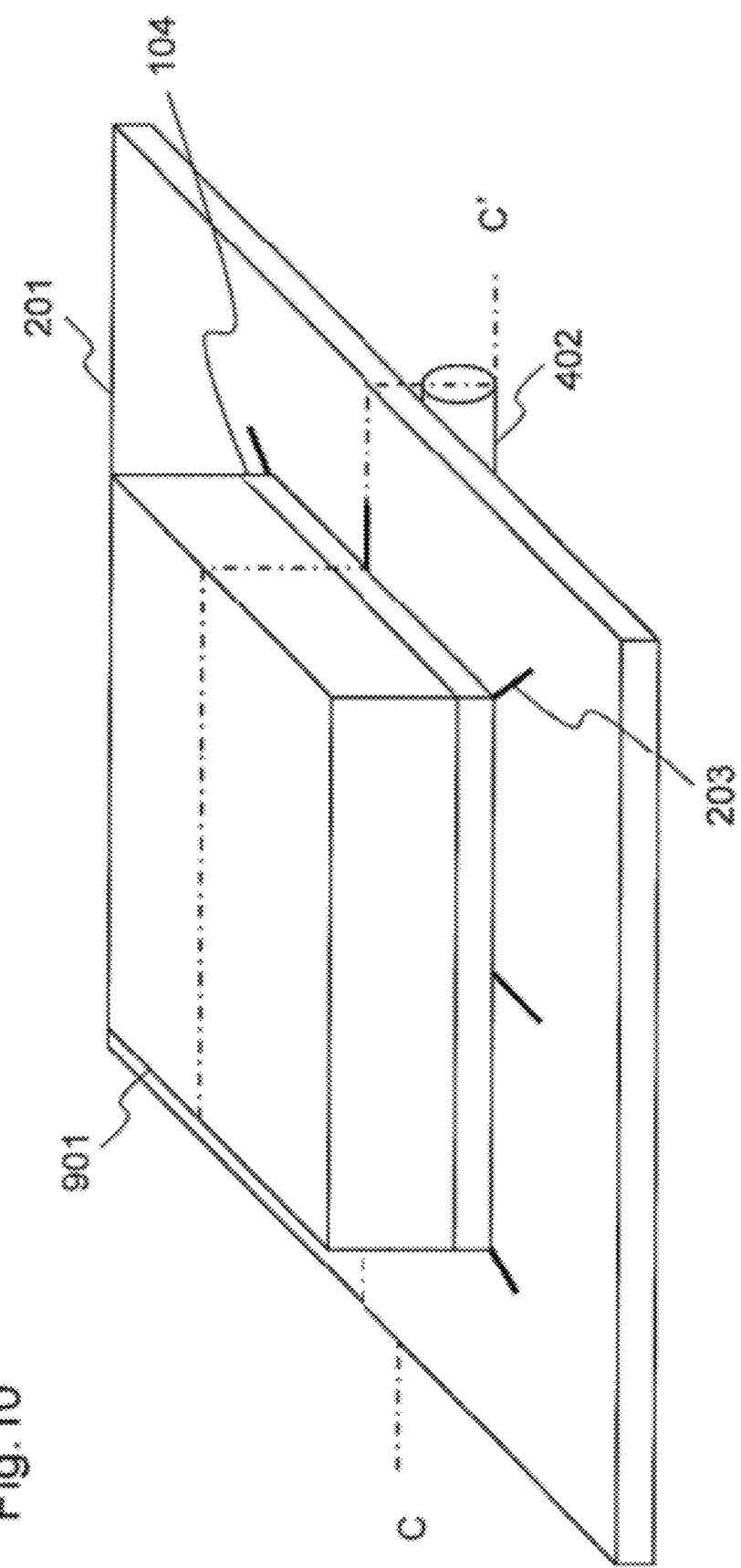
FIG. 10 is a perspective view showing the mounting configuration of an optical module of the second exemplary embodiment onto a circuit board.
Figure 12A:
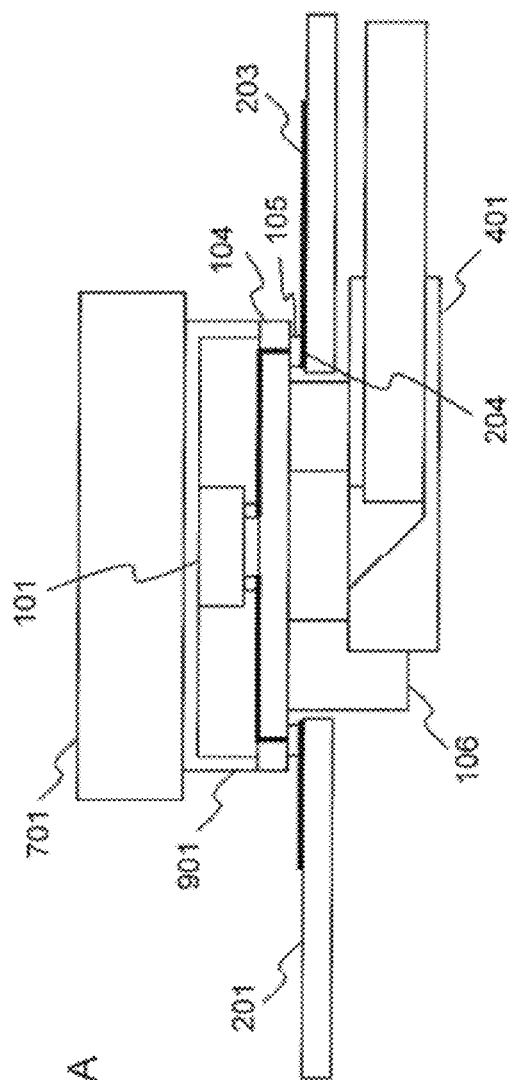
FIG. 12A and FIG. 12B are sectional views of an optical module of the second exemplary embodiment on which a heat sink is attached.
Figure 12B:
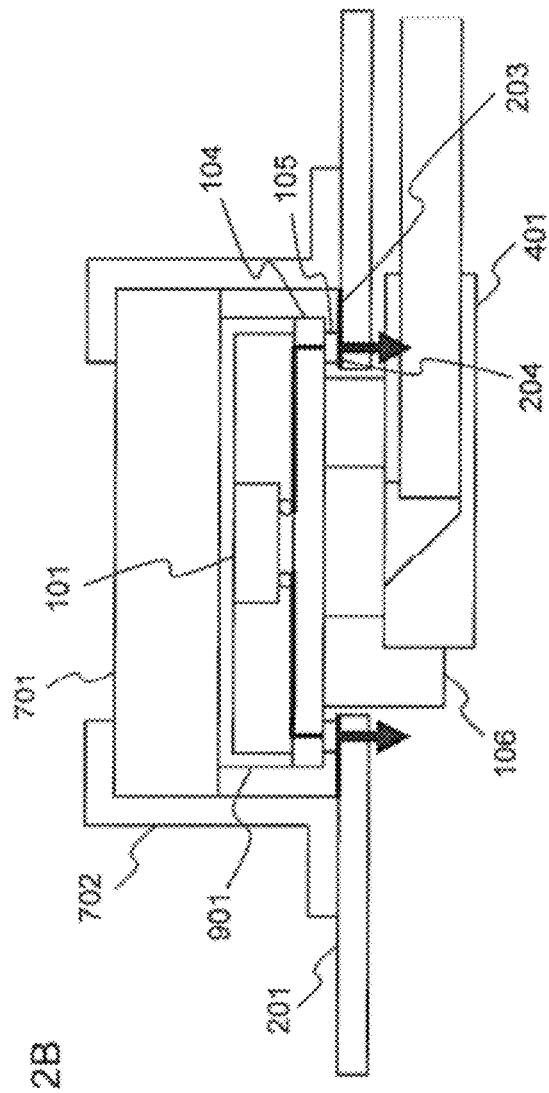

An optical module may have a case. An optical module of the second exemplary embodiment has a case. FIG. 9A and FIG. 9B are a top view and a bottom view showing the structure of the optical module of the second exemplary embodiment. FIG. 9C and FIG. 9D are sectional views showing the structure of the optical module of the second exemplary embodiment. FIG. 9C is a sectional view when the optical module of the second exemplary embodiment taken along line A-A' in FIG. 9A and FIG. 9B. FIG. 9D is a sectional view when the optical module of the second exemplary embodiment taken along line B-B'. FIG. 10 is a perspective view showing the mounting configuration of the optical module of the second exemplary embodiment to a circuit board. FIG. 11A, FIG. 11B and FIG. 11C are sectional views showing the mounting configuration of the optical module of the second exemplary embodiment to a circuit board. FIG. 12A and FIG. 12B are sectional views of the optical module of the second exemplary embodiment on which a heat sink is installed.

The optical module of the second exemplary embodiment is one in which a case is added to the optical module of the first exemplary embodiment, and the other structure is the same as that of the optical module of the first exemplary embodiment. That is, as shown in FIG. 9C and FIG. 9D, the optical module of the second exemplary embodiment has a case 901. It is desirable that the case 901 is formed by a material with a high thermal conductivity such as metal. The case 901 is in contact with the optical device 101. Alternatively, by arranging a material with a high thermal conductivity between the case 901 and the optical device 101, the case 901 does not need to contact the optical device 101 directly.

The mounting configuration of the optical module of the second exemplary embodiment to a circuit board is as shown in FIG. 10, FIG. 11A, FIG. 11B and FIG. 11C. About FIG. 10, FIG. 11A, FIG. 11B and FIG. 11C, because they are the same as the case of the optical module of the first exemplary embodiment (FIG. 3, FIG. 4A, FIG. 4B and FIG. 4C) except for having the case 901, description will be omitted. Further, the optical module of the second exemplary embodiment can be mounted on different circuit boards as shown in FIG. 5A, FIG. 5B, FIG. 5C and FIG. 6.

In the optical module of this exemplary embodiment, heat which the optical device 101 and other devices contained in the case 901 generate is conducted to the case 901 first and then radiated into air. The area of the case 901 touching air is large compared with that of the optical device 101. Therefore, the heat radiation performance of an optical module with the case 901 is higher than that of an optical module without the case 901. Additionally, the case 901 protects the optical device 101 and the other devices from mechanical damage. Therefore, as shown in FIG. 12A and FIG. 12B, the heat sink 701 can be installed on the optical module safely.

The optical module of the second exemplary embodiment has a case which is in contact with the optical device. Therefore, the optical module has an effect that performance of heat radiation from an optical device is improved. There is also an effect that an optical device is prevented from mechanical damage and a heat sink is installed safely.

3. Third Exemplary Embodiment

Figure 13A:
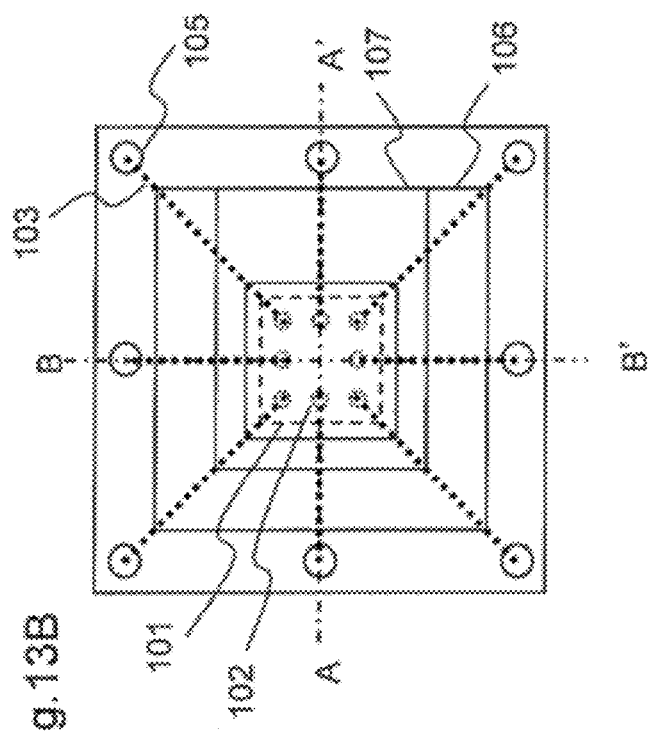
FIG. 13A is a top view showing the structure of an optical module of a third exemplary embodiment.
Figure 13C:
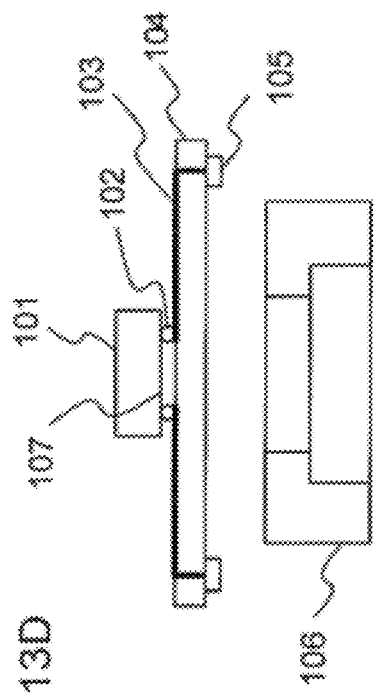
FIG. 13C and FIG. 13D are sectional views showing the structure of an optical module of the third exemplary embodiment.
Figure 13B:
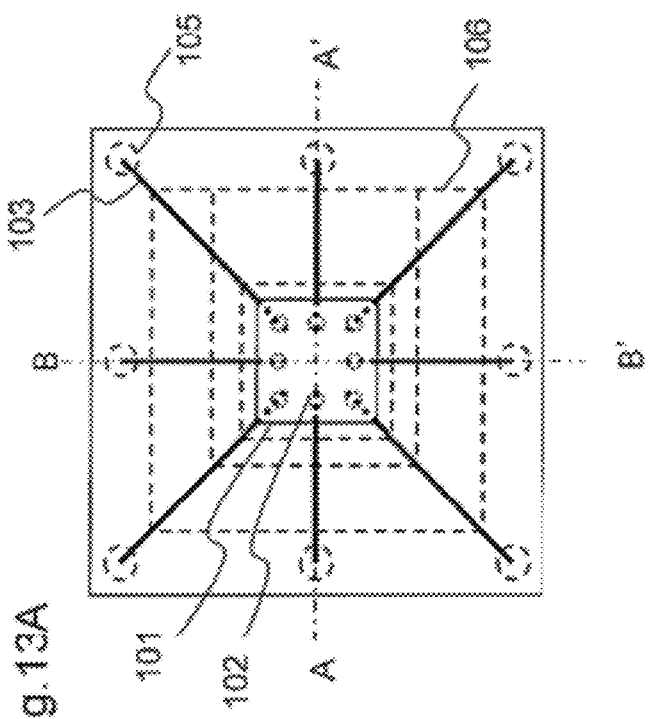
FIG. 13B is a bottom view showing the structure of an optical module of the third exemplary embodiment.
Figure 13D:
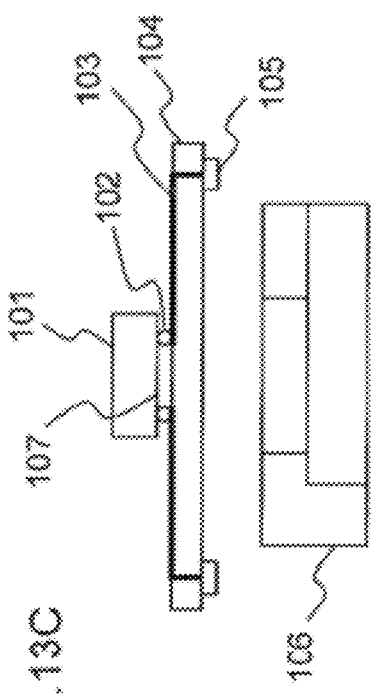
Figure 14:
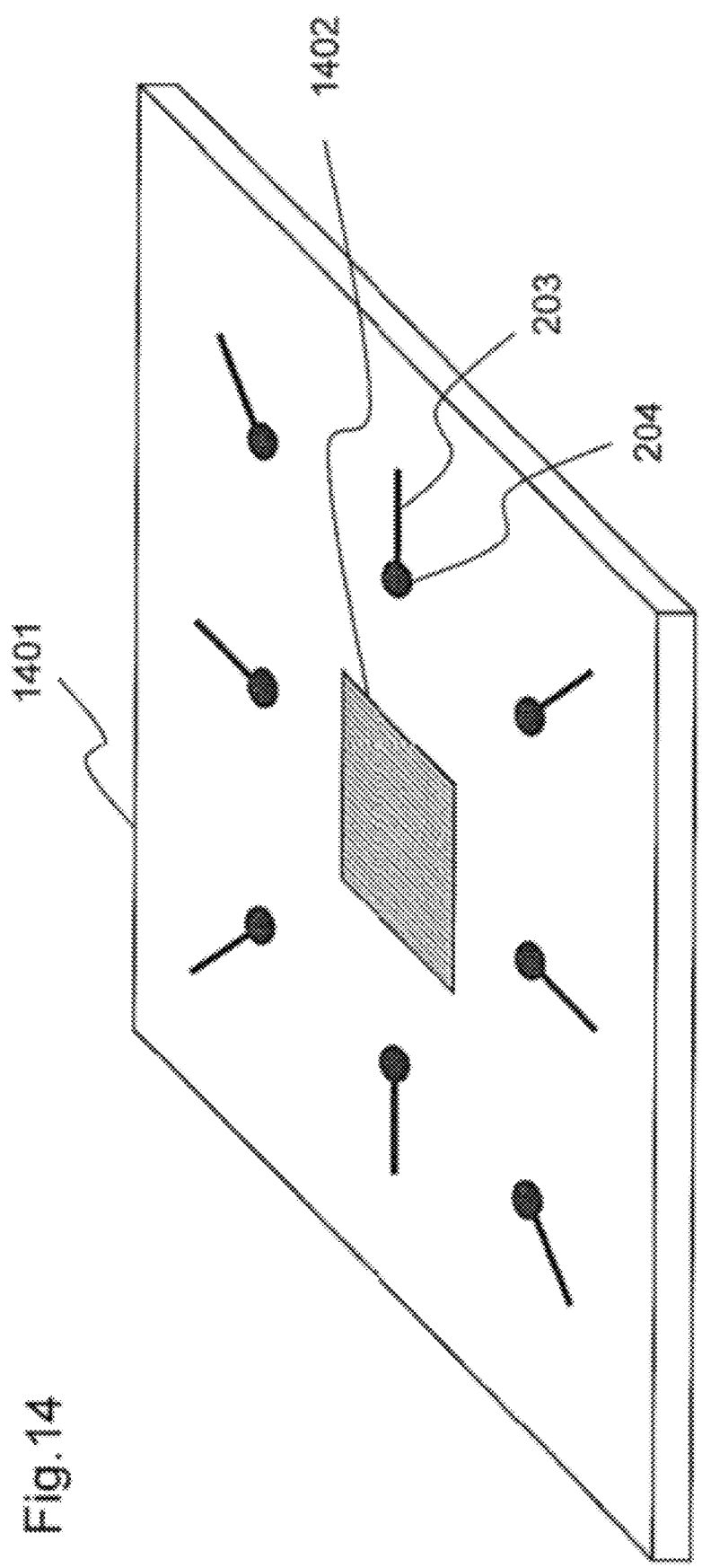
FIG. 14 is a perspective view of a circuit board on which an optical module of the third exemplary embodiment is mounted.
Figure 15:
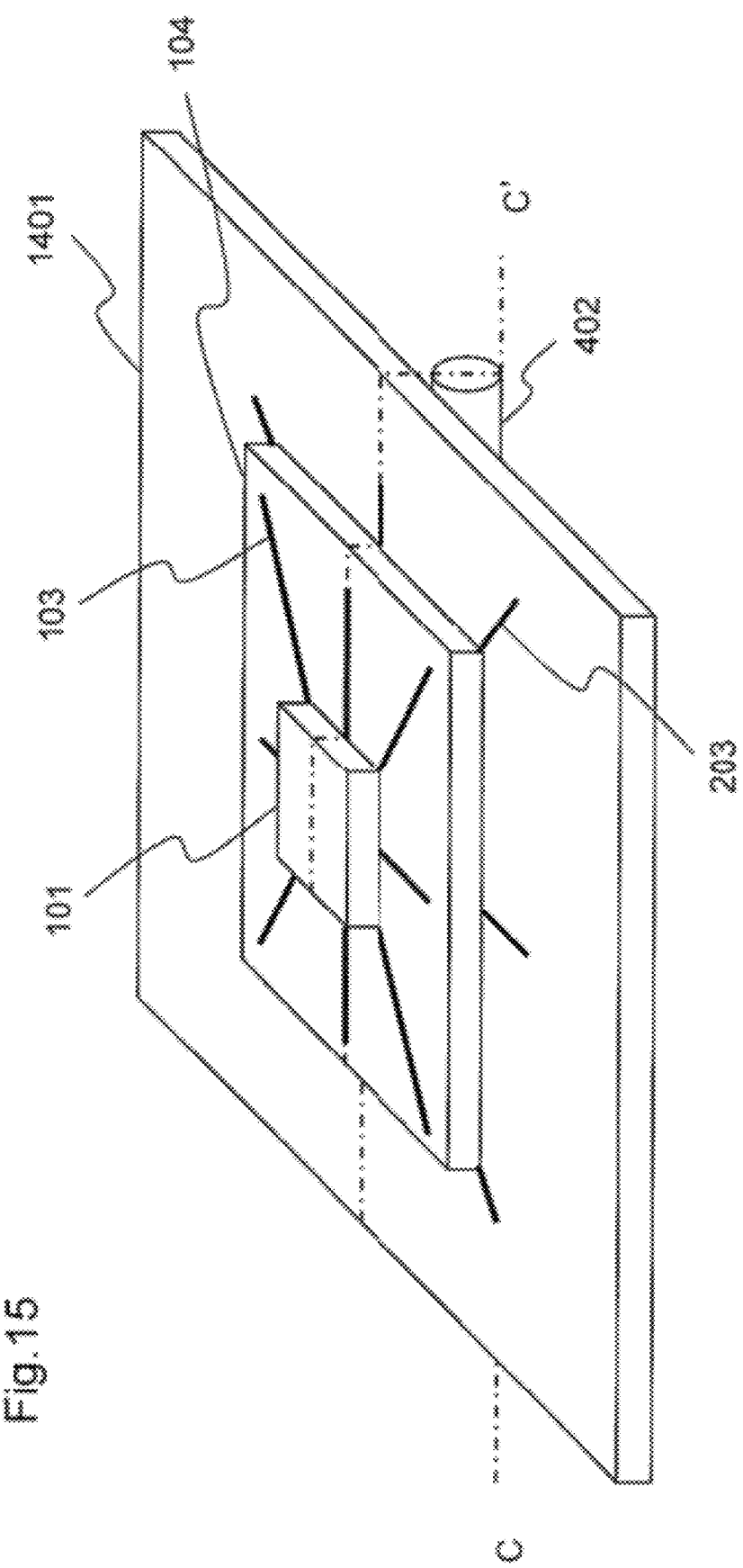
FIG. 15 is a perspective view showing the mounting configuration of an optical module of the third exemplary embodiment onto a circuit board.

Next, the third exemplary embodiment of the present invention will be described. FIG. 13A and FIG. 13B are a top view and a bottom view showing the structure of an optical module of the third exemplary embodiment. FIG. 13C and FIG. 13D are side views showing the structure of the optical module of the third exemplary embodiment. FIG. 13C is a sectional view when the optical module of the third exemplary embodiment taken along line A-A' in FIG. 13A and FIG. 13B. FIG. 13D is a sectional view when the optical module of the third exemplary embodiment taken along line B-B'. FIG. 14 is a perspective view of a circuit board on which the optical module of the third exemplary embodiment is mounted. FIG. 15 is a perspective view showing the mounting configuration of the optical module of the third exemplary embodiment to a circuit board. FIG. 16A, FIG. 16B and FIG. 16C are sectional views showing the mounting configuration of the optical module of the third exemplary embodiment to a circuit board. FIG. 17A and FIG. 17B are sectional views of the optical module of the third exemplary embodiment on which a heat sink is installed. FIG. 18 is a sectional view of the optical module of the third exemplary embodiment with a terminal of a different structure.

First, the structure of the optical module of the third exemplary embodiment will be described with reference to FIG. 13A, FIG. 13B, FIG. 13C and FIG. 13D.

Like the optical module of the first exemplary embodiment, the optical module of the third exemplary embodiment includes the optical device 101, the device electrode 102, the internal wiring 103, the optical device mounting substrate 104, the module terminal 105 and the transmission medium connector 106.

The structure of each of such components is the same as that of each component of the optical module of the first exemplary embodiment. A point that the structure of the optical module of the third exemplary embodiment and the optical module of the first exemplary embodiment is different is whether joining of the transmission medium connector 106 and the optical module main body exists or not. That is, in contrast with the optical module of the first exemplary embodiment where the optical module main body is united with the transmission medium connector 106, in the optical module of the third exemplary embodiment, the transmission medium connector 106 is separated from the optical module main body. Because difference between the entire structure of the optical module of the third exemplary embodiment and that of the optical module of the first exemplary embodiment is only this point and the other structure is common to each other, the description of the detailed structure will be omitted.

In the optical module of the third exemplary embodiment, the structure of a circuit board on which the optical module is mounted is different, because the transmission medium connector 106 is separated from the optical module main body. The structure of a circuit board on which the optical module of the third exemplary embodiment is mounted will be described with reference to FIG. 14. A circuit board 1401 is a circuit board on which an optical module is mounted and which has a light transparent part 1402 made of a transparent material. Meanwhile, the circuit board 1401 does not need to have the light transparent part 1402 in part and may be made of a transparent material as a whole. Other parts besides the optical module may be mounted on the circuit board 1401. A land 204 with which a circuit wiring 203 and the optical module are connected is provided on the upper surface of the circuit board 1401. The optical module and the other device (not shown) such as a CPU are connected to the circuit wiring 203.

Next, the mounting configuration of the optical module will be described with reference to FIG. 15, FIG. 16A, FIG. 16B and FIG. 16C. FIG. 15 is a perspective view when the optical module is mounted on a circuit board. FIG. 16A and FIG. 16C are sectional views when the optical module taken along line C-C' in FIG. 15. FIG. 16B is a sectional view of an optical connection medium connected to the optical module.

As shown in FIG. 15 and FIG. 16A, an optical module main body is mounted onto the upper surface of the circuit board 1401. The transmission medium connector 106 is mounted on the under surface of the circuit board 1401.

The optical module main body is fixed on the circuit board 1401 by joining the optical module terminal 105 and the land 204. Because the optical device 101 and the circuit wiring 203 are connected electrically at this moment, the optical device 101 can input and output a signal from/to the outside of the optical module. Alternatively, an optical module main body may be pressed against the circuit board 1401 using a predetermined fixing member without joining the optical module terminal 105 and the land 204. In this case, the module terminal 105 and the circuit wiring 203 are not necessary to be joined and should simply make contact each other. As described above, the mounting method of an optical module main body to the circuit board 1401 is the same as the mounting method in the first exemplary embodiment.

The transmission medium connector 106 is mounted onto the under surface of the circuit board 1401 so that the light transparent part 1402 may be covered. The transmission medium connector 106 is fixed by being adhered to the circuit board 1401 or pressed against the board by a predetermined fixing member.

Next, the connection configuration of a light transmission medium to an optical module will be described with reference to FIG. 16B and FIG. 16C. The light transmission medium 401 to be connected to the transmission medium connector 106 is shown in FIG. 16B. Because the light transmission medium 401 of FIG. 16B is the same as the light transmission medium shown in FIG. 4B, description will be omitted.

As shown in FIG. 16C, the light transmission medium 401 is connected to the transmission medium connector 106 using the optical connector 403. Input/output light between the optical device 101 and the optical fiber 402 passes through inside of the optical device mounting substrate 104, the light transparent part 1402 and the transmission medium connector 106. At this occasion, the direction of travel of input/output light is changed by the reflector plate 404 inside the optical connector 403 and the light progresses as shown by arrow L.

An apparatus in which an optical module and the circuit board 1401 are integrated as shown in FIG. 16A is a kind of an optical transmission apparatus. That is, as shown in FIG. 16C, this transmission apparatus can input and output a light signal from/to the outside by being connected with the light transmission medium 401. This transmission apparatus can also input and output an electric signal between the optical module and the outside via the circuit wiring 203.

Thus, the optical module of the third exemplary embodiment has the same structure as the optical module of the first exemplary embodiment except for a point that the transmission medium connector 106 is separated from the module main body. Therefore, the optical module of the third exemplary embodiment has the same effect as the optical module of the first exemplary embodiment. That is, in the optical module of the third exemplary embodiment, installation of an optical fiber is easy. Also, as shown in FIG. 17A and FIG. 17B, the heat sink 701 with high heat radiation performance can be installed easily. Further, this optical module suits ultrahigh-speed operation. As shown in FIG. 18, a module terminal 801 may be provided on a side face of an optical module.

Figure 19A:
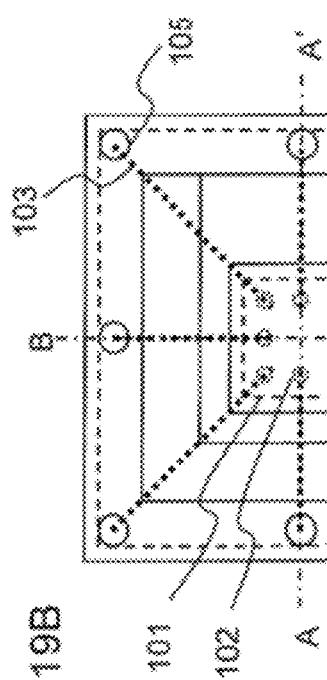
FIG. 19A is a top view showing the structure of an optical module of the third exemplary embodiment to which a case is added.
Figure 19B:
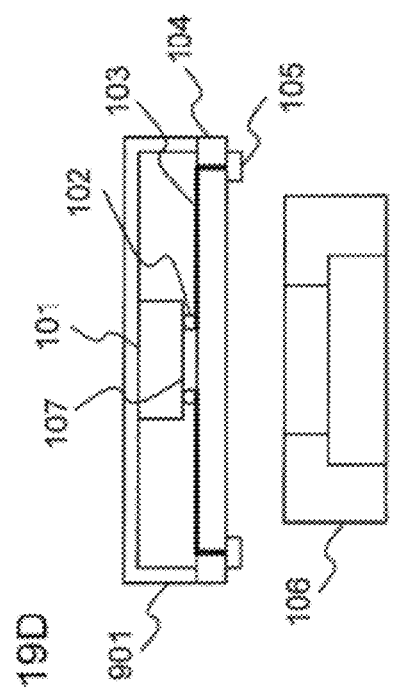
FIG. 19B is a bottom view showing the structure of an optical module of the third exemplary embodiment to which a case is added.
Figure 19C:
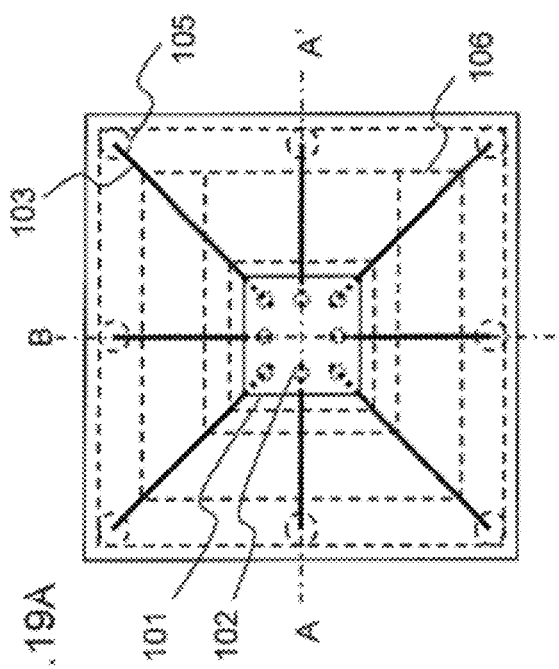
FIG. 19C and FIG. 19D are sectional views showing the structure of an optical module of the third exemplary embodiment to which a case is added.
Figure 19D:
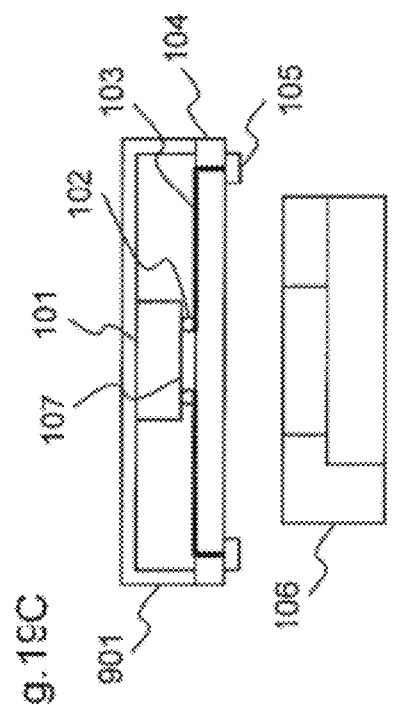

Also, a case may be added to the optical module of the third exemplary embodiment like the second exemplary embodiment. FIG. 19A and FIG. 19B are a top view and a bottom view showing the structure of the optical module of the third exemplary embodiment to which a case is added. FIG. 19C and FIG. 19D are sectional views showing the structure of the optical module of the third exemplary embodiment to which a case is added. FIG. 19C is a sectional view when the optical module taken along line A-A' in FIG. 19A and FIG. 19B. FIG. 19D is a sectional view when the optical module of the third exemplary embodiment taken along line B-B'. FIG. 20, FIG. 21A, FIG. 21B and FIG. 21C are a perspective view and sectional views showing the mounting configuration in which the optical module of the third exemplary embodiment with a case is mounted on a circuit board. FIG. 22A and FIG. 22B are sectional views of the optical module of the third exemplary embodiment to which a case and a heat sink are added. Because the respective structures are similar to those of the optical module of the second exemplary embodiment except for a point that the transmission medium connector 106 is separated from the module main body, the detailed description will be omitted.

Thus, the optical module of the third exemplary embodiment has an effect that it is easy to install an optical fiber, high heat radiation performance, easiness of installation of a heat sink and suitability to ultrahigh-speed operation like the first exemplary embodiment.

Further, a part or the whole of a circuit board on which the optical module of the third exemplary embodiment is mounted have only to be transparent. Therefore, a circuit board has only to be made of a transparent material, and thus there is an effect that an opening does not need to be provided in a circuit board.

4. Fourth Exemplary Embodiment

To the optical module of the first, second and third exemplary embodiment, a light transmission medium with a reflector plate is connected. A reflector plate which reflects input/ output light may be provided in the optical module. FIG. 23A, FIG. 23B, FIG. 23C, FIG. 24A, FIG. 24B and FIG. 24C are sectional views showing the connection configuration of the optical module and a light transmission medium of the fourth exemplary embodiment. FIG. 23A, FIG. 23B and FIG. 23C indicate an optical module in which a reflector plate is provided in the transmission medium connector of the optical module of the first exemplary embodiment. FIG. 24A, FIG. 24B and FIG. 24C indicate an optical module in which a reflector plate is provided in a transmission medium connector of the optical module of the third exemplary embodiment.

The connection configuration of a light transmission medium to an optical module of the fourth exemplary embodiment will be described with reference to FIG. 23A, FIG. 23B and FIG. 23C. The inside of the transmission medium connector 106 is hollow, and input/output light can pass through the inside of the connector. In the optical module of the fourth exemplary embodiment, as shown in FIG. 23A, a reflector plate 110 is provided in a location along the hollow pass inside the transmission medium connector 106. The reflector plate 110 changes a direction of travel of input/output light between the optical module and an optical fiber 2302.

A light transmission medium 2301 connected to the transmission medium connector 106 of the optical module of the fourth exemplary embodiment is shown in FIG. 23B. The light transmission medium 2301 includes the optical fiber 2302 and an optical connector 2303.

As shown in FIG. 23C, the light transmission medium 2301 is connected to the transmission medium connector 106 using the optical connector 2303. Input/output light between the optical device 101 and the optical fiber 2302 passes through inside the optical device mounting substrate 104, the opening 202 and the transmission medium connector 106, and propagates forward along arrow L with the direction of the travel of the input/output light being changed by the reflector plate 110 on the way of the input/output light.

The connection configuration of a light transmission medium to the optical module in FIG. 24A, FIG. 24B and FIG. 24C and the path of the input/output light between the optical device 101 and the optical fiber 2302 is the same as that about the optical module in FIG. 23A, FIG. 23B and FIG. 23C. However, in the optical module of FIG. 24A, FIG. 24B and FIG. 24C, the input/output light passes through the light transparent part 1402, not through the opening 202.

Thus, because the optical fiber 2302 can be arranged in parallel with the circuit board 201 and 1401 also in the optical module of the fourth exemplary embodiment, it is easy to install an optical fiber between the circuit board 201 and 1401 on which an optical module is mounted and another board.

Also about heat radiation, heat generated inside the case 901 is radiated into air efficiently like the first or second exemplary embodiment.

Further, it is needless to say that a case may be added to the optical module of the fourth exemplary embodiment like the second exemplary embodiment.

Thus, the optical module of the fourth exemplary embodiment has an effect that the optical module has easiness of installation of an optical fiber, high heat radiation performance and ultrahigh-speed operation capability like the first and second exemplary embodiment.

In the optical module of the fourth exemplary embodiment, it is not necessary to have a reflector plate in a light transmission medium, and thus there is an effect that the structure of the light transmission medium is simplified.

5. Fifth Exemplary Embodiment

Figure 25:
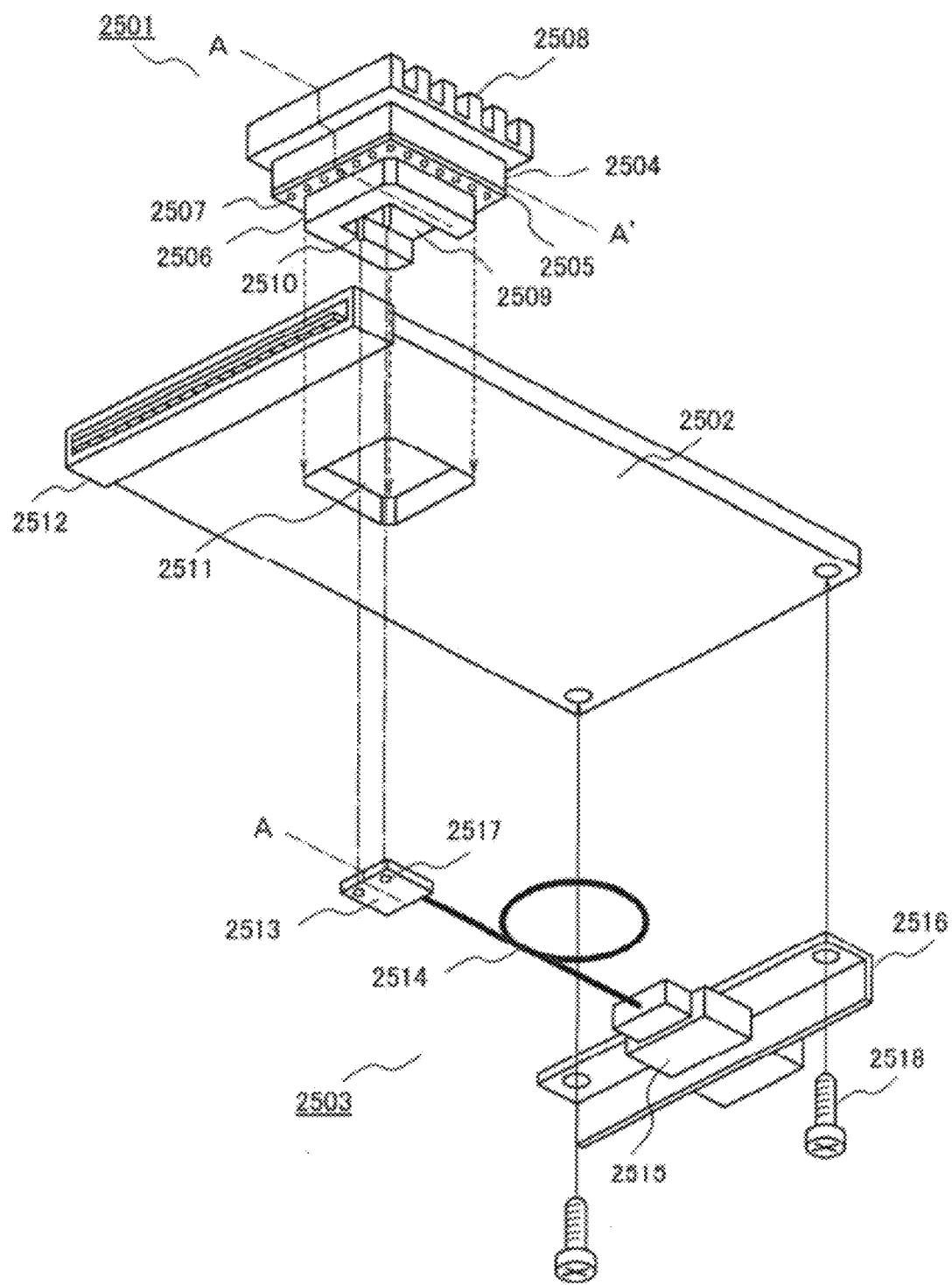
FIG. 25 is a perspective view showing the structure of an optical transmission apparatus of a fifth exemplary embodiment seen from the lower side.
Figure 26:
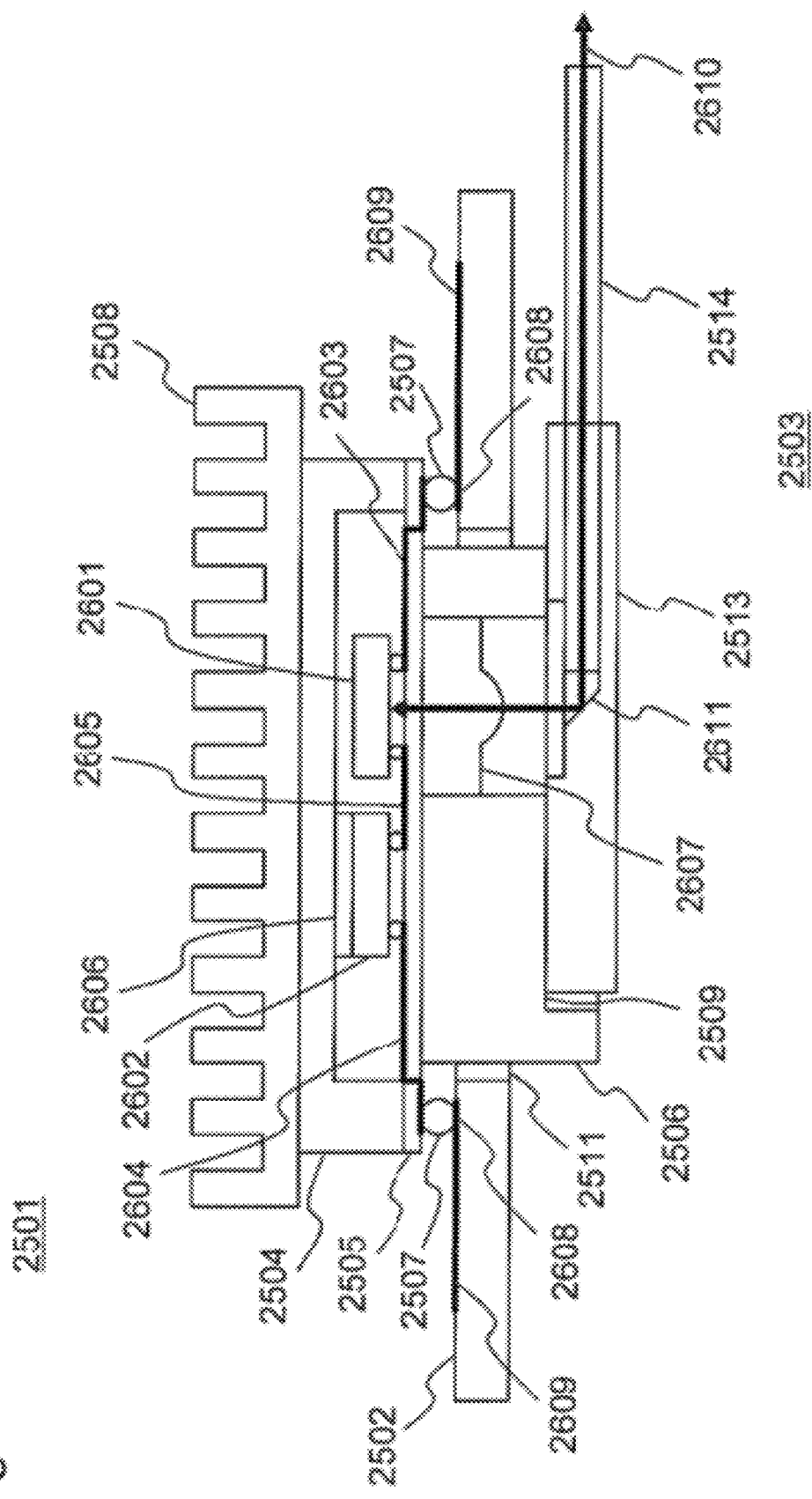
FIG. 26 is a sectional view of the optical module part of an optical transmission apparatus of the fifth exemplary embodiment.

Next, an example of an embodiment of an optical transmission apparatus using the optical module of the first exemplary embodiment of the present invention is described. FIG. 25 is a perspective view of the structure of an optical transmission apparatus of the fifth exemplary embodiment of the present invention seen from the lower side. FIG. 26 is a sectional view when the optical module part of an optical transmission apparatus of the fifth exemplary embodiment taken along line A-A' in FIG. 25.

As shown in FIG. 25, the optical transmission apparatus is an apparatus in which an optical module 2501 of the second exemplary embodiment is inserted from the upper surface of a circuit board 2502, and a light transmission medium 2503 is connected in the lower surface side.

The optical module 2501 includes a case 2504, a transparent substrate 2505, an optical fiber receptacle 2506, a module terminal 2507 and a heat sink 2508. The optical fiber receptacle 2506 has a light transmission medium connecting face 2509 in a lower part. A guide pin 2510 for connecting the light transmission medium 2503 is provided on the light transmission medium connecting face 2509. The optical fiber receptacle 2506 and the transparent substrate 2505 are joined.

The circuit board 2502 is provided with an opening 2511 and an electric connector 2512. The circuit wiring (not illustrated) is formed on the upper surface (the surface on which the optical module 2501 is mounted) of the circuit board 2502.

The light transmission medium 2503 includes an optical connector 2513, an optical fiber 2514, an optical connector adapter 2515 and a bracket 2516. The optical connector 2513 is provided with a guide hole 2517 for inserting the guide pin 2510, and is connected to the light transmission medium connecting face 2509. The bracket 2516 is fixed on the circuit board 2502 with screws 2518.

Next, the detailed structure of the optical module 2501 will be described. The detailed structure of the optical module 2501 is shown in FIG. 26. The optical module 2501 includes the case 2504, the transparent substrate 2505, the optical fiber receptacle 2506, the module terminal 2507 and the heat sink 2508. By joining the transparent substrate 2505 to the optical fiber receptacle 2506, the optical module 2501 is unified.

A relatively thin substrate like a flexible substrate can be used as the transparent substrate 2505. Meanwhile, the transparent substrate 2505 does not need to be transparent as a whole and only a part which input/output light passes through has to be transparent The meaning of "transparent" is the same as that defined in the first exemplary embodiment.

The case 2504 is joined to the transparent substrate 2505. An optical device 2601 and an optical device driver IC 2602 are mounted on the transparent substrate 2505 on which internal wirings 2603, 2604 and 2605 are formed. The internal wiring 2603 connects the module terminal 2507 and the optical device 2601. The internal wiring 2604 connects the module terminal 2507 and the optical device driver IC 2602. The internal wiring 2605 connects the optical device 2601 and the optical device driver IC 2602.

In the optical module 2501, a device with the largest heat generation is the optical device driver IC 2602. Therefore, in order to improve heat radiation performance of the optical device driver IC 2602, a heat radiation agent 2606 is provided between the case 2504 and the optical device driver IC 2602. The heat radiation agent 2606 conducts heat which the optical device driver IC 2602 generates to the case 2504 efficiently. The heat conducted to the case 2504 is radiated to the outside from the heat sink 2508.

A lens 2607 is provided inside the optical fiber receptacle 2506. The lens 2607 is a planer microlens array, for example, and performs optical coupling of the optical module 2501 and the optical connector 2513 efficiently. That is, the lens 2607 concentrates the light emitted by the optical device 2601 to transmit the light into the optical fiber 2514. Alternatively, the lens 2607 concentrates the light from the optical fiber 2514 and transmits the light to the optical device 2601.

The optical fiber receptacle 2506 entirely extends through the opening 2511. The optical connector 2513 is connected to the light transmission medium connecting face 2509 in the lower side of the optical fiber receptacle 2506.

In the optical module 2501, the optical fiber receptacle 2506 and the module main body are unified. Therefore, the optical module 2501 is fixed by joining a land 2608 provided on the circuit board 2502 and the optical module terminal 2507. At this occasion, the electrical connection of the internal wirings 2603, 2604 and a circuit wiring 2609 on the circuit board 2502 is also completed simultaneously.

A light signal 2610 inputted to and outputted from the optical device 2601 passes through the transparent substrate 2505. Then, by connecting the optical connector 2513 to the light transmission medium connecting face 2509, a light signal 2610 between the optical module 2501 and the outside is connected. The 45-degree inclined mirror 2611 built-in inside the optical connector 2513 changes the course of the light signal 2610 that travels in a direction vertical to the circuit board 2502 to a course in a direction parallel to the circuit board 2502.

The optical module of this exemplary embodiment incorporates an optical device and an optical device driver IC. When an optical device driver IC is not needed, only an optical device may be incorporated. In the optical module of this exemplary embodiment, both of an optical device and an optical device driver IC are mounted on a transparent substrate. Each of the optical device and the optical device driver IC may be mounted onto a different substrate. However, in the substrate on which the optical device is mounted, an area which light passes through needs to be transparent so that light received or emitted by the optical device will pass through the area.

The module terminal and the land of a circuit board needs to be connected electrically. Therefore, the module terminal and the land of the circuit board have to make contact with each other. However, the module terminal and the land of the circuit board do not have to be joined. For example, an optical module may be pressed against the circuit board and fixed using other members in order to fix the optical module. In this case, the module terminal and the land of the circuit board do not have to be joined, but have only to make contact with each other.

Another purpose of the optical module of this exemplary embodiment is to improve heat radiation performance of devices incorporated in the case. Therefore, a heat sink is attached on the case. The case and the heat sink need to be touched so that heat may be conducted efficiently. Alternatively, the case and the heat sink may be bonded together. A heat radiation member may be inserted between the case and the heat sink. Both of an optical device and an optical device driver IC do not need to be incorporated in a case. However, it is preferable that at least a device desirable to be cooled is incorporated in the case so that heat radiation performance for heat generated by the device may be improved.

As described above, in an optical transmission apparatus of this exemplary embodiment, an optical module is mounted on the upper surface side of a circuit board with the case being arranged in the upper side, and a heat sink is attached on the case. With such structure, the heat sink can scatter heat generated by an optical module efficiently.

Further, in an optical transmission apparatus of this exemplary embodiment, the case of an optical module is mounted onto the upper surface of a circuit board and a light input/output part is mounted onto the under surface of the circuit board. Also, a light transmission medium is connected at the under side of the circuit board. Thus, in this optical transmission apparatus, the main body of an optical module is mounted onto the upper surface of a circuit board, and an optical transmission path is arranged in the under side of the circuit board. Usually, electronic parts besides an optical module are often mounted on a face of a circuit board which is the same as the face on which the optical module is mounted. Accordingly, when an optical module is mounted on a circuit board, if an optical fiber is arranged in the same side as the optical module, arrangement of the optical fiber may be difficult because of interference of the other electronic parts and the optical fiber. In contrast, in an optical transmission apparatus of this exemplary embodiment, a surface on which an optical module and other electronic parts are mounted and a surface on which an optical fiber is arranged are opposite surfaces of the circuit board. Therefore, laying an optical fiber is easy because the optical fiber and the electronic parts do not interfere.

In an optical transmission apparatus of this exemplary embodiment, a module terminal and a land provided on a circuit board are joined or make contact with each other to connect the optical module and the circuit board electrically. The optical module terminal is provided on the surface of the transparent substrate opposite to the surface on which an optical device and an optical device driver IC are mounted. Accordingly, in a high-speed electric signal path from the optical device or the optical device driver IC to the circuit board, there is not a step besides a short via in the transparent substrate and besides a part of the path passing through the optical device. The structure of the signal path between the optical device or the optical device driver IC, and the circuit board like the above reduces the attenuation and the reflection of high-speed electric signal transmission.

Further, a 45-degree inclined mirror (reflector plate) inside an optical connector may be provided inside an optical fiber receptacle (transmission medium connector) like the fourth exemplary embodiment.

As described above, in an optical transmission apparatus of this exemplary embodiment, an optical fiber extends in one side of a circuit board, while a heat sink is mounted in another side of the circuit board. Therefore, there is an effect that installation of a heat sink is easy and heat radiation performance improves. In addition, there also is an effect that an optical fiber is easily laid, because an optical fiber does not extend in a side on which the case of an optical module is mounted, thus reducing the risk of interference with other parts on the circuit board.

Further, chips of an optical device and an optical device driving device are mounted facing their light receiving/emitting surfaces or faces for connecting with a substrate to a transparent substrate. The transparent substrate is close to the circuit board. Accordingly, the wiring length between the circuit board and those devices is short. Therefore, there also is an effect that the optical transmission apparatus suits ultra-high-speed operation.

Further, a module terminal is provided on the lower part of an optical module main body. Therefore, when an optical module is pressed in the circuit board direction, a force in the direction of pressing the module terminal against the circuit board is added. Accordingly, there also is an effect that a problem on the mounting reliability does not occur.

Regarding a circuit board, only an opening has to be provided and regarding mounting of a module to a circuit board, only joining or contacting the module terminal and the land on the circuit board is needed. Accordingly, the optical transmission apparatus also has an effect that it is easy to manufacture an optical transmission apparatus.

6. Sixth Exemplary Embodiment

Figure 27:
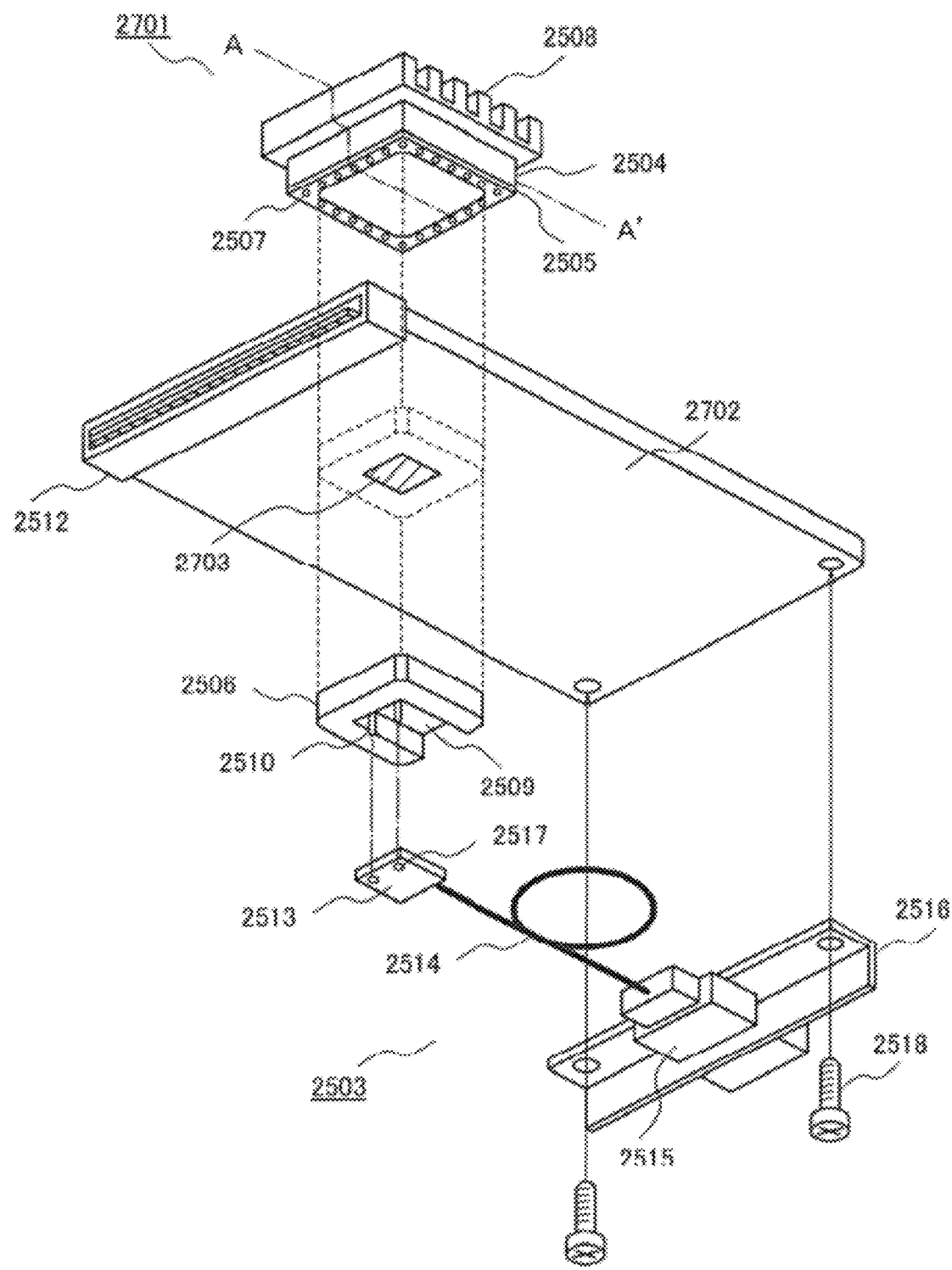
FIG. 27 is a perspective view showing the structure of an optical transmission apparatus of a sixth exemplary embodiment seen from the lower side.
Figure 28:
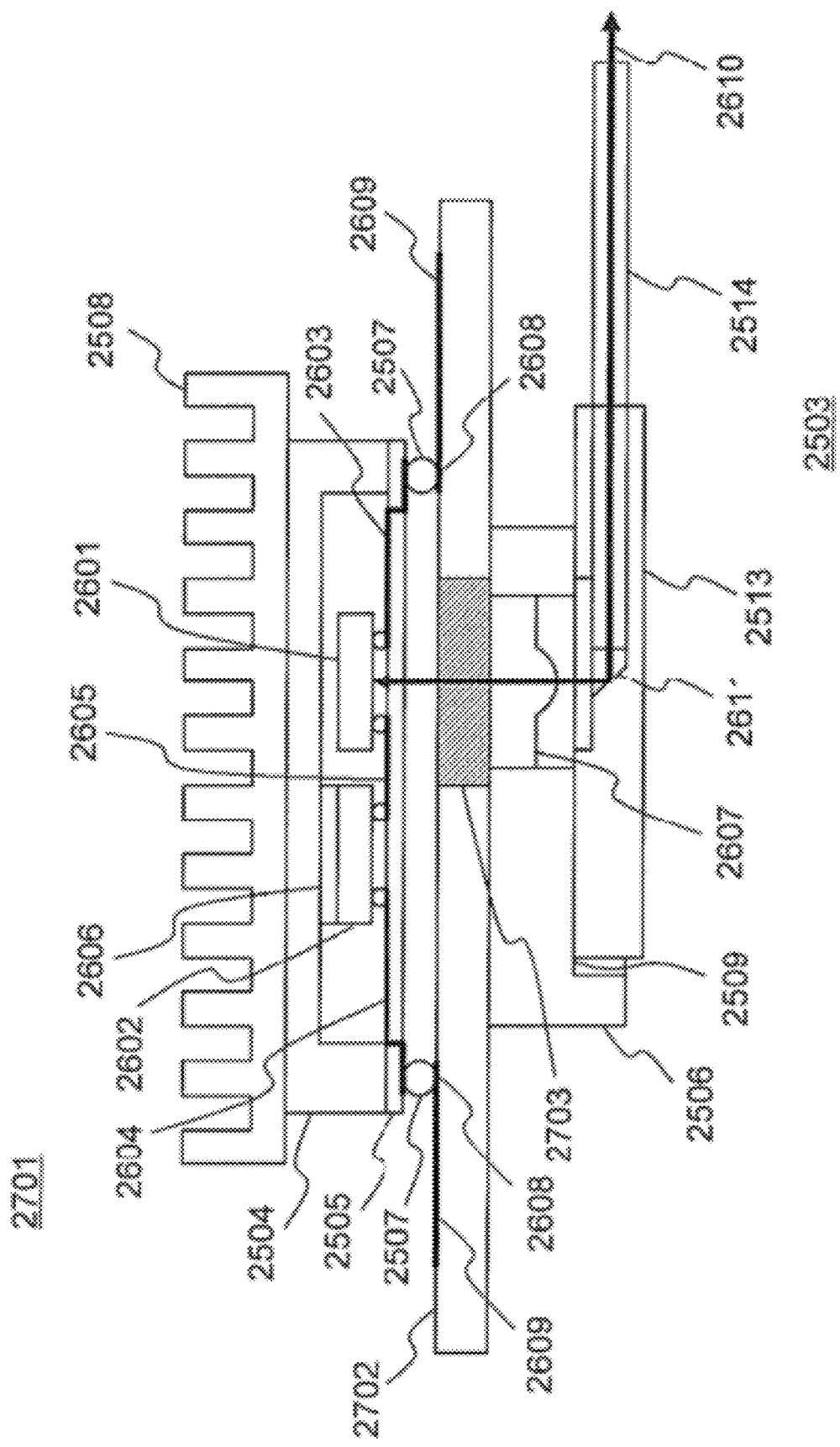
FIG. 28 is a sectional view of the optical module part of an optical transmission apparatus of the sixth exemplary embodiment.

Next, an exemplary embodiment of an optical transmission apparatus using the optical module of the third exemplary embodiment of the present invention is described. FIG. 27 is a perspective view of the structure of an optical transmission apparatus of the sixth exemplary embodiment of the present invention seen from the lower side. FIG. 28 is a sectional view when the optical module part of an optical transmission apparatus of the sixth exemplary embodiment taken along line A-A' of FIG. 27.

As shown in FIG. 27, an optical transmission apparatus mounts the optical fiber receptacle 2506 of an optical module 2701 of the third exemplary embodiment on the under surface of a circuit board 2702, and a part comprising the other parts, which part is called a "module main body", is mounted onto the upper surface of the circuit board 2702. The light transmission medium 2503 is connected to the optical fiber receptacle 2506.

The optical module 2701 includes the case 2504, the transparent substrate 2505, the optical fiber receptacle 2506, the module terminal 2507 and the heat sink 2508. The optical fiber receptacle 2506 has the light transmission medium connecting face 2509 in the lower part. The guide pin 2510 for connecting the light transmission medium 2503 is provided on the light transmission medium connecting face 2509. The optical fiber receptacle 2506 and the transparent substrate 2505 are not joined and are separated in two blocks, a module main body in the upper part and the optical fiber receptacle 2506 in the lower part.

The circuit board 2702 includes a light transparent part 2703 and the electric connector 2512. The circuit wiring (not illustrated) is formed on the upper surface (the surface on which the optical module 2701 is mounted) of the circuit board 2702.

Because the light transmission medium 2503 is the same as the light transmission medium 2503 of the fifth exemplary embodiment, the detailed description will be omitted. The optical connector 2513 is connected to the light transmission medium connecting face 2509. The bracket 2516 is fixed on the circuit board 2702.

The detailed structure of the optical module 2701 is shown in FIG. 28. Each component of the optical module 2701 has the same structure as the optical module 2501 of the fifth exemplary embodiment. Therefore, the description of each component will be omitted. However, in contrast with the optical module 2501, in the optical module 2701, the transparent substrate 2505 is not joined to the optical fiber receptacle 2506.

The optical fiber receptacle 2506 is mounted so as to cover a light transparent part 2703 provided in the circuit board 2702. The module main body which is the upper part of the optical module 2701 is fixed by joining the optical module terminal 2507 to the land 2608 provided on the circuit board 2702. At this occasion, the electric connection of the internal wiring 2603, 2604 and the circuit wiring 2609 on the circuit board 2702 is also completed simultaneously. The optical fiber receptacle 2506 is fixed on the lower part of the circuit board 2702 using a predetermined member.

The light signal 2610 inputted to and outputted from the optical device 2601 passes through the transparent substrate 2505. By connecting the optical connector 2513 to the transmission medium connecting face 2509, the light signal 2610 between the optical module 2701 and the outside is connected. The 45-degree inclined mirror 2611 incorporated inside the optical connector 2513 changes the course of the light signal 2610 in a vertical direction to the circuit board 2702 to a direction parallel to the circuit board 2702.

Meanwhile, when an optical device driver IC is not needed, an optical device has only to be included in the optical module of the sixth exemplary embodiment like the optical module of the fifth exemplary embodiment. Each of the optical device and the optical device driver IC may be mounted onto a different substrate. However, in the substrate on which the optical device is mounted, an area through which light passes needs to be transparent.

In the sixth exemplary embodiment, the module terminal and the land of a circuit board need to be connected electrically like the optical module of the fifth exemplary embodiment. Therefore, the module terminal and the land of the circuit board have to make contact with each other. However, it does not necessarily mean that they have to be joined.

The optical module of the sixth exemplary embodiment also has high heat radiation performance because the optical module has a heat sink similarly.

In an optical transmission apparatus of the sixth exemplary embodiment, mounting is performed such that the case of an optical module is located in the upper surface of a circuit board and a light input/output part is mounted onto the under surface of the circuit board. Also, a light transmission medium is connected at the under side of the circuit board. Therefore, laying an optical fiber is easy because the optical fiber and the electronic parts do not interfere.

Further, in an optical transmission apparatus of the sixth exemplary embodiment, because there are only some low steps in the signal path from the optical device or the optical device driver IC to the circuit board, high-speed electric signal transmission with reduced attenuation and reflection is possible.

Also, like the fifth exemplary embodiment, a 45-degree inclined mirror (reflector plate) may be provided inside an optical fiber receptacle (transmission medium connector) not inside an optical connector.

Thus, the optical module of the present exemplary embodiment has an effect that the optical module has easiness of installation of an optical fiber, high heat radiation performance and ultrahigh-speed operation capability like the fifth exemplary embodiment.

Only a light transparent part has to be provided in a circuit board, or alternatively, the whole body of the circuit board has just to be made transparent, and consequently, an opening does not need to be provided. Accordingly, the optical module also has an effect that manufacturing of the circuit board is easy.

Meanwhile, each of the above mentioned exemplary embodiments can be combined with each of the other exemplary embodiments.

7. Seventh and Eighth Exemplary Embodiment

An optical module according to an aspect of the present invention includes: an optical device mounting board including a first surface, a second surface on a reverse side of the first surface, and a light transparent part allowing a light to pass through the first transparent part; an optical device mounted on the first surface, which is a light emitting device emitting an emitted light traveling in a direction from the first surface to the second surface through the first transparent part or a light receiving device receiving a received light traveling in a direction from the second surface to the first surface through the first transparent part; a terminal mounted on a surface except the first surface of the optical device mounting board; a wiring connecting an electrode of a component mounted on the first surface including the optical device with the terminal; and a transmission medium connector connecting a light transmission medium transmitting the emitted light traveling in a direction from the second surface to an outside of the optical module or the received light traveling in a direction from the outside to the second surface.

An optical transmission method according to another aspect of the present invention includes: mounting an optical device which is a light emitting device emitting an emitted light or a light receiving device receiving a received light on a first surface of an optical device mounting board including the first surface, a second surface on a reverse side of the first surface, and a first light transparent part allowing the emitted light traveling in a direction from the first surface to the second surface and the received light traveling in a direction from the second surface to the first surface to pass through the first transparent part; connecting a terminal mounted or a surface except the first surface of the optical device mounting board with an electrode of a component mounted on the first surface including the optical device; transmitting an electric signal through the terminal joined or contacted with a circuit wiring on a mounting surface of a mounting board; and transmitting the emitted light traveling in a direction from the second surface to an outside or the received light traveling in a direction from the outside to the second surface through a light transmission medium connected from a side of a rear surface of the mounting surface to the second surface.

There is a problem with each of the above-mentioned publicly known techniques. First, an optical module has a problem about heat radiation performance. Generally, an optical module which performs photoelectric conversion generates heat when operating. In an optical module, a laser diode employed as a light emitting device is driven, for example. At this occasion, the optical module consumes electric power and generates heat. Accordingly, in order to utilize characteristics of a laser diode fully, the generated heat is needed to be radiated efficiently by a heat sink or the like to cool the optical module. Even if an optical device incorporated in an optical module is either a light emitting diode or a light receiving device, there is no difference between them about importance of heat radiation, although there is a difference in a heat value.

In an optical module of patent document 1, when a heat value is high, it is desired to provide a heat sink on the upper surface of an optical module to improve heat radiation performance. When a heat sink is provided, the upper surface of an optical module has to be opened. Accordingly, as shown in FIG. 30, for example, an optical module of patent document 1 is mounted in a form that the upper part of a module is inserted in an opening 3002 provided in a circuit board 3001. Then, a heat sink 3003 is installed onto an upper surface 3004 of the optical module.

Meanwhile, when the heat sink 3003 is installed, in order to reduce thermal resistance between the upper surface 3004 and the heat sink 3003, it is desirable that the heat sink 3003 is pressed from the top. At this occasion, force is added to a joining part 3005 of the circuit board 3001 and the optical module in the direction to tear off the optical module from the board. This force affects joining reliability of the optical module and the wiring of the circuit board 3001. That is, there is a problem with connection reliability in the mounting configuration of FIG. 30 for installing the heat sink 3003. Thus, an optical module of patent document 1 has a problem that the optical module does not suit installation of a heat sink.

In an optical module of the non-patent document, as shown in FIG. 29, a heat sink cannot be attached on the upper surface of the optical module, because the optical module has a light input/output part equipped with the flat-plate micro lens array 2906 on the upper surface of the package. For this reason, in this optical module, radiation is realized only by heat conduction 2909 from an under surface 2902 of the optical module to a circuit board 2908. However, because plastic is often used in the circuit board 2908 as a material, thermal resistance of the board is high. Therefore, in an optical module with a high heat value, there is a high possibility that enough radiation is not realized. Further, the heat conduction 2909 to the circuit board 2908 may affect other parts mounted on the circuit board 2908 negatively. Or, because the other parts also generate heat similarly, an effect of the radiation may not be obtained sufficiently. As mentioned above, in heat radiation using the circuit board 2908, there are problems with thermal resistance of a circuit board and mutual influence with other parts.

Meanwhile, it is desirable that the drawing direction of the optical fiber from an optical module is a direction in a side opposite to that of a surface of a circuit board on which an optical module and other parts are mounted. However, in the optical module on patent document 1, the drawing direction of the optical fiber is the direction of the side of the surface of the circuit board on which the optical module is mounted. FIG. 31 is a top view showing the mounting configuration of the optical module of patent document 1 to a circuit board. An electronic device 3101 (such as a CPU) which inputs and outputs an electric signal and an optical module 3102 are mounted onto a circuit board 3104. Optical fibers 3103 are drawn out from the optical module 3102. Components 3105 besides the optical module are mounted on a surface of the circuit board 3104 on which the optical module is mounted. In this case, in order to avoid interference of the components 3105 and the optical fibers 3103, some restrictions are needed in arrangement of the optical fibers 3103. Also, when the optical fibers 3103 are laid so as not to interfere with the components 3105, it is possible that the optical fibers 3103 interfere with each other at a portion like an area 3106. Thus, in the optical module on patent document 1, because an optical fiber is drawn in a direction of the side of a surface on which the optical module is mounted, there is a problem that the optical module does not suit highly integrated mounting to a circuit board.

Further, as shown in FIG. 29, in the optical module of non-patent document, the optical device 2902 and the optical device driver IC 2903 are mounted on the transparent resin board 2901 distant from the circuit board 2908. Accordingly, the wiring length from the optical device 2902 and the optical device driver IC 2903 to an optical module terminal 2910 is long. Therefore, there is the problem that the optical module does not suit ultrahigh-speed operation.

In the optical module on patent document 2, because the optical module radiates heat using a heat sink, a problem about heat generation does not occur. Also, there is not a problem with reliability of joining of the optical module and a wiring of the circuit board when a heat sink is pressed on the optical module.

However, the optical module on patent document 2 radiate luminous light only in the rear surface direction of the circuit board, and does not have a structure for inputting and outputting light from and to another optical device. That is, the optical module is equipped with neither a transmission path for inputting and outputting light from and to another optical device such as an optical fiber nor a structure with which such transmission path is connected. Thus, there is a problem that it has no means or methods to take out a light signal in any direction from a circuit board on which the optical module is mounted.

In addition, in the optical module on patent document 2, the wiring length between an input-output terminal of the optical module and a light emitting device chip is long, because the light emitting device chip is mounted on a module substrate by wire bonding. Therefore, this optical module is not suitable for outputting an ultrahigh-speed signal. The above mentioned problems of patent document 2 about the method of taking out a light signal and about supporting ultrahigh-speed operation are also found similarly in a case when a light emitting device is changed to a light receiving device.

An optical module and an optical transmission method of the present invention have an effect that a light transmission medium can be connected. The optical module and the optical transmission method also have effects that they are excellent in heat radiation performance, suit high-speed operation and have high mounting reliability.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

The invention claimed is:

1. An optical module comprising:
   an optical device mounting board including a first surface, a second surface on a reverse side of the first surface, and a first light transparent part allowing an emitted light traveling in a direction from the first surface to the second surface and a received light traveling in a direction from the second surface to the first surface to pass through the first transparent part;
   an optical device mounted on the first surface, which is a light emitting device emitting the emitted light or a light receiving device receiving the received light, and of which a wiring terminal is formed on a same surface as a light emission or light receiving side, wherein the light emission or light receiving side of the optical device faces the first surface of the mounting board;
   a first terminal mounted on a surface except the first surface of the optical device mounting board;
   a wiring connecting a second terminal of a component mounted on the first surface including the optical device with the first terminal; and
   a transmission medium connector connecting a light transmission medium transmitting the emitted light traveling in a direction from the second surface to an outside of the optical module or the received light traveling in a direction from the outside to the second surface.

2. The optical module according to claim 1, wherein
   a first part which includes the optical device mounting board, the optical device, the first terminal and the wiring, and excludes the transmission medium connector is mounted on a mounting surface of a mounting board including an opening, and
   at least a part of a second part which includes the transmission medium connector and excludes the optical device mounting board, the optical device, the first terminal and the wiring is inserted into the opening.

3. The optical module according to claim 2, wherein at least a part of an interior surface of the opening comes into contact with the second part when the second part is inserted into the opening.

4. The optical module according to claim 1, wherein
   a first part which includes the optical device mounting board, the optical device, the first terminal and the wiring, and excludes the transmission medium connector is mounted on a mounting surface of a mounting board including a second light transparent part allowing the emitted light and the received light to pass through the second light transparent part,
   a second part which includes the transmission medium connector and excludes the optical device mounting board, the optical device, the first terminal and the wiring is mounted on the second light transparent part in a rear surface of the mounting surface, and
   the emitted light or the received light passes through the second light transparent part and travels between the optical device and the light transmission medium.

5. The optical module according to claim 1, wherein the first terminal is mounted on the second surface.

6. The optical module according to claim 1, wherein the first terminal is mounted on a third surface connecting between a circumference of the first surface and a circumference of the second surface.

7. The optical module according to claim 1, wherein the optical device is mounted on the optical device mounting board with flip-chip technology.

8. The optical module according to claim 1, further comprising:
   a case incorporating at least a part of the component.

9. The optical module according to claim 8, further comprising:
   a heat radiator radiating heat generated by the component incorporated by the case.

10. The optical module according to claim 1, wherein the transmission medium connector includes a reflector changing a direction of travel of the emitted light or the received light.

11. The optical module according to claim 1, wherein the light transmission medium includes a reflector changing a direction of travel of the emitted light or the received light.

12. A mounting board comprising:
    a mounting surface adapted to mount to the optical module according to claim 1; and
    an opening, wherein
    a first part of the optical module which includes the optical device mounting board, the optical device, the first terminal and the wiring, and excludes the transmission medium connector is mounted on the mounting surface, and
    at least a part of a second part of the optical module which includes the transmission medium connector and excludes the optical device mounting board, the optical device, the first terminal and the wiring is inserted into the opening.

13. A mounting board comprising:
    a mounting surface on which the optical module according to claim 1 can be mounted;
    a second light transparent part allowing the emitted light or the received light to pass through the second light transparent part, wherein
    a first part of the optical module which includes the optical device mounting board, the optical device, the first terminal and the wiring, and excludes the transmission medium connector is mounted on the mounting surface, and a second part of the optical module which includes the transmission medium connector and excludes the optical device mounting board, the optical device, the first terminal and the wiring is mounted on the second light transparent part in a rear surface of the mounting surface.

14. The mounting board according to claim 12, further comprising:
a mounting part adapted to mount to a fixing member fixing a heat radiator radiating heat generated by the optical module.

15. The mounting board according to claim 13, further comprising:
a mounting part on which a fixing member fixing a heat radiator radiating heat generated by the optical module can be mounted.

16. An optical transmission apparatus: comprising:
the optical module according to claim 1; and
a mounting board comprising a mounting surface on which the optical module can be mounted; and an opening, wherein a first part of the optical module which includes the optical device mounting board, the optical device, the first terminal and the wiring, and excludes the transmission medium connector is mounted on the mounting surface, and at least a part of a second part of the optical module which includes the transmission medium connector and excludes the optical device mounting board, the optical device, the first terminal and the wiring is inserted into the opening.

17. An optical transmission apparatus: comprising:
the optical module according to claim 1; and
a mounting board comprising a mounting surface on which the optical module according to claim 1 can be mounted a second light transparent part allowing the emitted light or the received light to pass through the second light transparent part, wherein a first part of the optical module which includes the optical device mounting board, the optical device, the first terminal and the wiring, and excludes the transmission medium connector is mounted on the mounting surface, and a second part of the optical module which includes the transmission medium connector and excludes the optical device mounting board, the optical device, the first terminal and the wiring is mounted on the second light transparent part in a rear surface of the mounting surface.

* * * * *